US010056935B2

(12) United States Patent
Lee

(10) Patent No.: US 10,056,935 B2
(45) Date of Patent: *Aug. 21, 2018

(54) SWITCHING CIRCUITS FOR WIRELESS APPLICATIONS

(71) Applicant: SKYWORKS SOLUTIONS, INC., Woburn, MA (US)

(72) Inventor: Junhyung Lee, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/497,120

(22) Filed: Apr. 25, 2017

(65) Prior Publication Data
US 2017/0294937 A1  Oct. 12, 2017

Related U.S. Application Data

(63) Continuation of application No. 14/737,453, filed on Jun. 11, 2015, now Pat. No. 9,634,718.

(60) Provisional application No. 62/011,148, filed on Jun. 12, 2014, provisional application No. 62/011,150, filed on Jun. 12, 2014.

(51) Int. Cl.
H04B 1/44 (2006.01)
H04B 7/08 (2006.01)
H03K 17/16 (2006.01)

(52) U.S. Cl.
CPC ............. *H04B 1/44* (2013.01); *H03K 17/161* (2013.01); *H04B 7/0831* (2013.01)

(58) Field of Classification Search
CPC ......... H04B 15/00; H04B 1/44; H04B 7/0831
USPC .......................................................... 455/78
See application file for complete search history.

(56) References Cited

U.S. PATENT DOCUMENTS

| 4,464,636 A | 8/1984 | Dobrovolny |
| 5,589,844 A | 12/1996 | Belcher et al. |
| 7,236,060 B2 | 6/2007 | Wood |
| 2003/0119472 A1 | 6/2003 | Das |
| 2003/0133047 A1 | 7/2003 | Yamamoto |
| 2007/0121350 A1 | 5/2007 | Duvnjak |
| 2008/0160929 A1 | 7/2008 | Lee |
| 2009/0254873 A1 | 10/2009 | Uriu et al. |

(Continued)

FOREIGN PATENT DOCUMENTS

WO 2015191928 A1 12/2015

OTHER PUBLICATIONS

International Search Report and Written Opinion for PCT/US2015/035434 dated Oct. 16, 2015.

*Primary Examiner* — April G Gonzales
(74) *Attorney, Agent, or Firm* — Chang & Hale LLP

(57) ABSTRACT

Switching circuits for wireless applications. In some embodiments, a switching circuit can include a common node and a plurality of series arm switches with each being capable of connecting the common node and a respective signal node. The switching circuit can further include a shunt arm switch for each of the series arm switches. The shunt arm switch can be capable of connecting the signal node of the respective series arm switch to a ground. The switching circuit can further include a compensation circuit coupled to the common node and configured to compensate for a parasitic effect resulting from some or all of the series arm switches and the shunt arm switches.

19 Claims, 18 Drawing Sheets

(56) References Cited

U.S. PATENT DOCUMENTS

| | | | |
|---|---|---|---|
| 2010/0001351 A1* | 1/2010 | Zhang | H01L 27/0207 |
| | | | 257/392 |
| 2011/0267154 A1 | 11/2011 | Carroll et al. | |
| 2012/0062306 A1* | 3/2012 | Bakalski | H04B 1/006 |
| | | | 327/419 |
| 2012/0202445 A1 | 8/2012 | Manetakis | |
| 2012/0262217 A1 | 10/2012 | Gorbachov et al. | |
| 2014/0004804 A1 | 1/2014 | Suh et al. | |
| 2014/0009203 A1* | 1/2014 | Cebi | H03K 17/162 |
| | | | 327/379 |
| 2014/0011463 A1* | 1/2014 | Madan | H04B 1/44 |
| | | | 455/78 |
| 2014/0125135 A1* | 5/2014 | Walker | H03F 1/0222 |
| | | | 307/77 |
| 2016/0020816 A1* | 1/2016 | Lee | H04B 1/44 |
| | | | 455/78 |

* cited by examiner

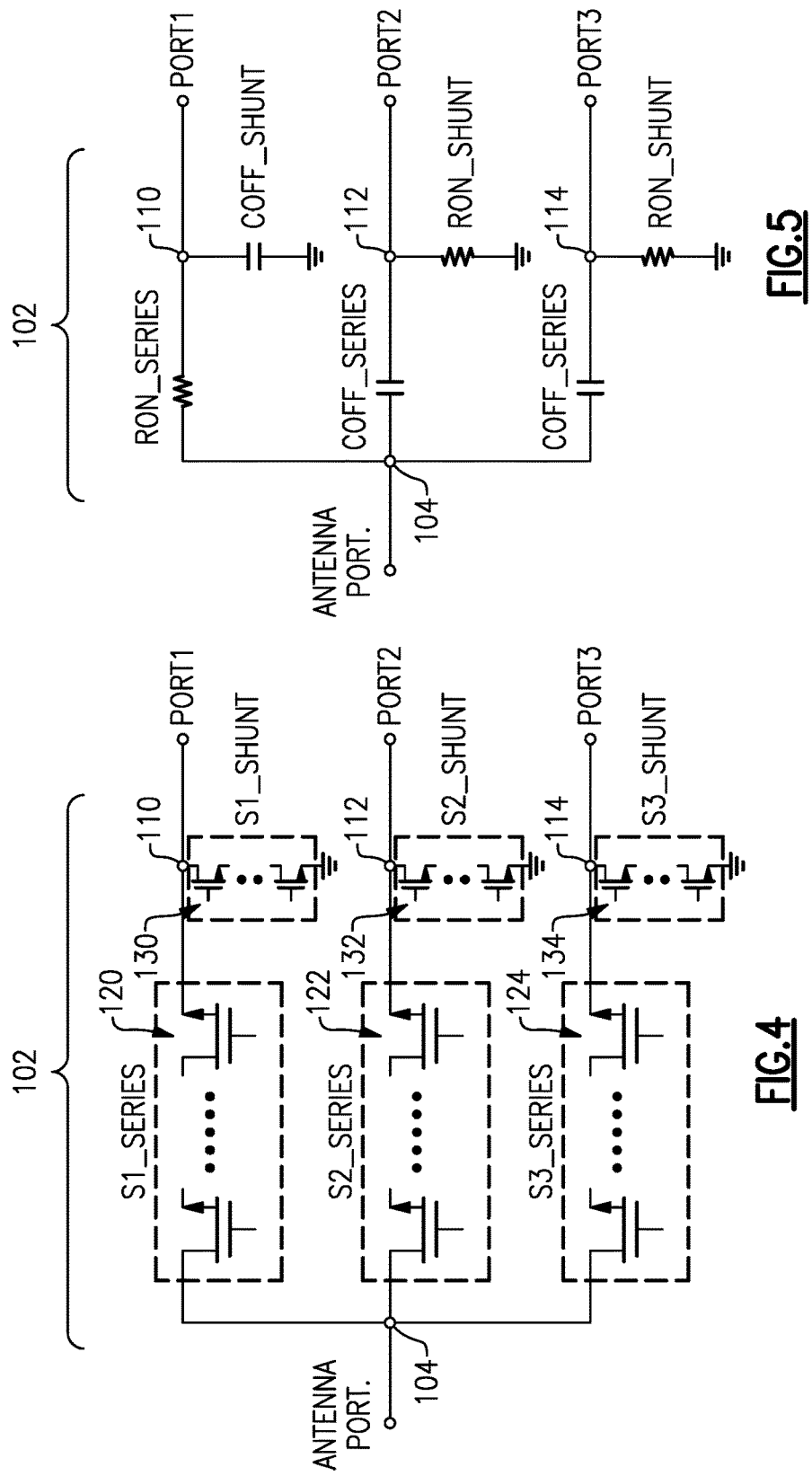

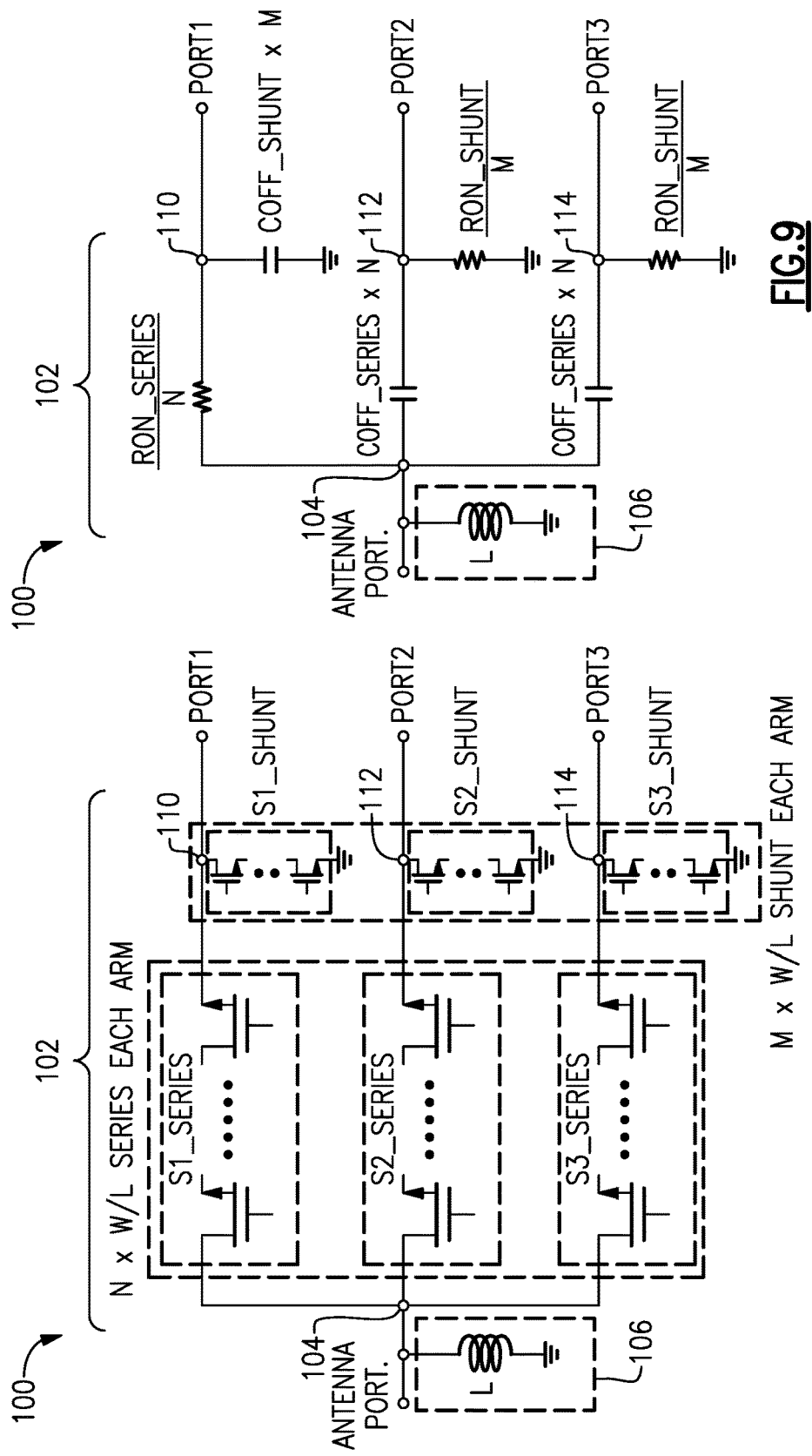

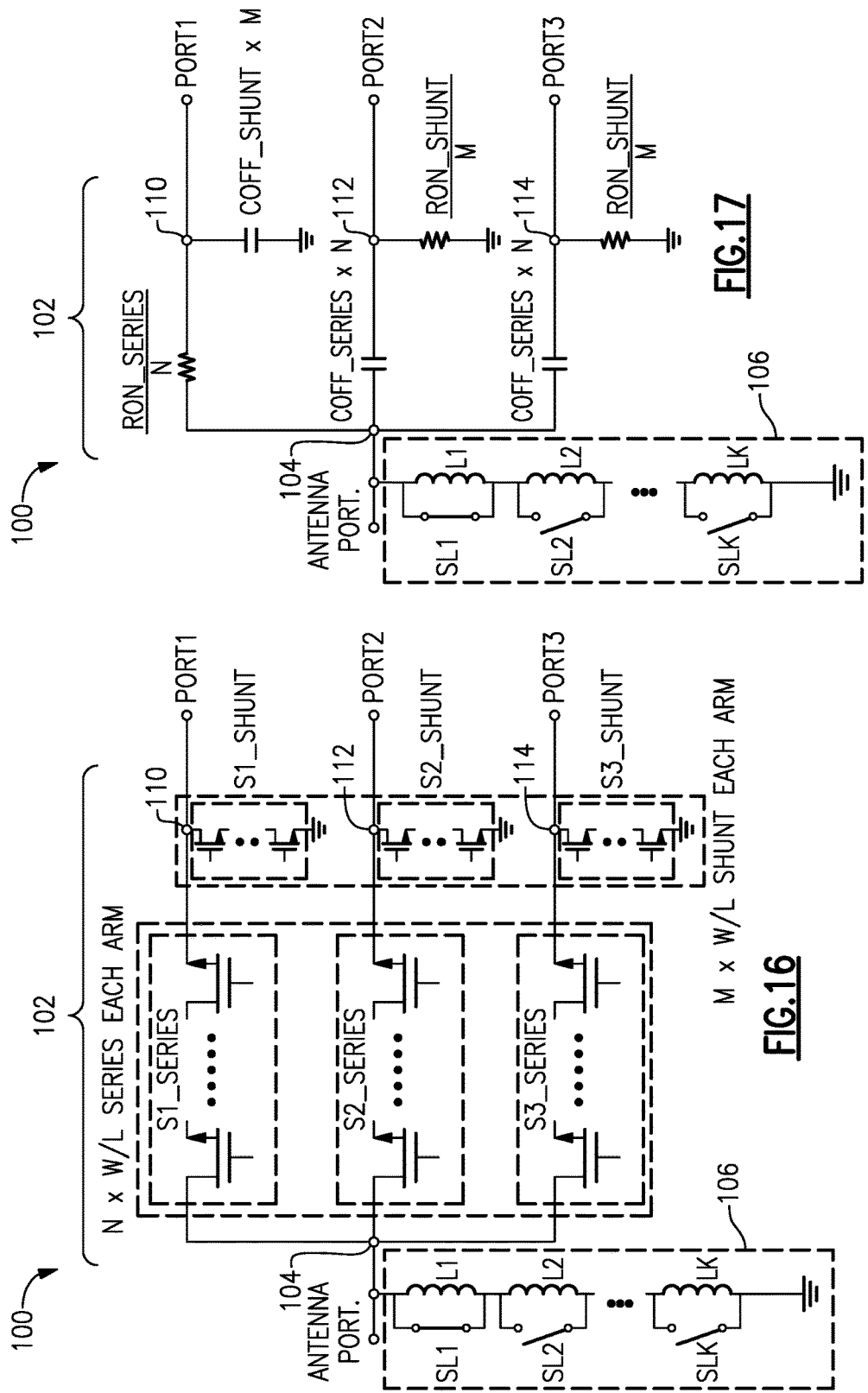

SWITCHING CIRCUITS FOR WIRELESS APPLICATIONS

CROSS-REFERENCE TO RELATED APPLICATION(S)

This application is a continuation of U.S. application Ser. No. 14/737,453 filed Jun. 11, 2015, entitled ARCHITECTURES AND METHODS RELATED TO INSERTION LOSS REDUCTION AND IMPROVED ISOLATION IN SWITCH DESIGNS, which claims priority to U.S. Provisional Application Nos. 62/011,148 filed Jun. 12, 2014, entitled ARCHITECTURES AND METHODS RELATED TO INSERTION LOSS REDUCTION AND IMPROVED ISOLATION IN SWITCH DESIGNS, and 62/011,150 filed Jun. 12, 2014, entitled CIRCUITS AND METHODS RELATED TO ADJUSTABLE COMPENSATION FOR PARASITIC EFFECTS IN RADIO-FREQUENCY SWITCH NETWORKS, the benefits of the filing dates of which are hereby claimed and the disclosures of which are hereby expressly incorporated by reference herein in their respective entirety.

BACKGROUND

Field

The present disclosure relates to radio-frequency (RF) switches.

Description of the Related Art

In many radio-frequency (RF) applications, switches are utilized to facilitate routing of RF signals. Such switches can be affected by one or more performance related parameters such as insertion loss, isolation and parasitic effect.

SUMMARY

In some implementations, the present disclosure relates to a switching architecture that includes a switch network that having one or more switchable radio-frequency (RF) signal paths, with each path contributing to a parasitic effect associated with the switch network. The switching architecture further includes a parasitic compensation circuit coupled to a node of the switch network. The parasitic compensation circuit is configured to compensate for the parasitic effect of the switch network.

In some embodiments, the switch network can include a plurality of switchable RF signal paths. The node of the switch network can be a common node for the plurality of switchable RF signal paths such that each switchable RF signal path is implemented between the common node and a respective path node. The common node can be an antenna port.

In some embodiments, each of the plurality of switchable RF signal paths can include a series arm switch configured to connect the common node and its respective path node in an ON state, and disconnect the common node from its respective path node in an OFF state. Each of the plurality of switchable RF signal paths can further include a shunt arm switch configured to connect its respective path node to a ground when the corresponding series switch arm is in the OFF state, and disconnect the path node from the ground when the series switch arm is in the ON state. Each series arm switch can include a stack of transistor devices, with each transistor device having an off-capacitance Coff that increases with its size, and each shunt arm switch can include a stack of transistor devices, with each transistor device having an off-capacitance Coff that increases with its size. Each transistor device of the series arm switch can include N field-effect transistor(s) (FET(s)) arranged in a parallel configuration, and each transistor device of the shunt arm switch can include M FET(s) arranged in a parallel configuration, each of N and M being a positive integer.

In some embodiments, the parasitic compensation circuit can include an inductive circuit that couples the common node and the ground, with the inductive circuit having an inductance of L that compensates for a parasitic effect resulting from the off-capacitances of the series arm switches and the shunt arm switches. The inductance L of the parasitic compensation circuit can be selected to have a value of $L=1/[4\pi^2 f^2 (Coff\_total)]$, with the quantity f being an operating frequency, and the quantity Coff_total being a total off-capacitances of the switch network. The presence of the inductance L of the parasitic compensation circuit can allow either or both of the series arm and shunt arm switch transistors to be sized larger to improve switch performance while reducing the parasitic effect of the off-capacitances of the series arm switches and the shunt arm switches.

The switch performance can include insertion loss performance. The sizes of either or both of the series arm and shunt arm switch transistors can be larger than corresponding transistors of a switching architecture without the inductance L of the parasitic compensation circuit. The switch network of the switching architecture with the inductance L of the parasitic compensation circuit can have a lower insertion loss than that of the switching architecture without the inductance L.

The switch performance can include isolation performance. The size of the shunt arm switch transistor can be larger than a corresponding transistor of a switching architecture without the inductance L of the parasitic compensation circuit. The switch network of the switching architecture with the inductance L of the parasitic compensation circuit can have a higher isolation than that of the switching architecture without the inductance L.

In some embodiments, the inductive circuit can be configured to provide a substantially fixed value for the inductance of L of the parasitic compensation circuit. In some embodiments, the inductive circuit can be configured to provide a plurality of different values for the inductance of L of the parasitic compensation circuit. In such an adjustable-inductance configuration, the inductive circuit can include, for example, a plurality of switchable inductors connected in series. Each switchable inductor can include an inductor and a switch arranged in parallel. Inductance values of the switchable inductors can be substantially the same, or can be different. In some embodiments, the different inductance values can be selected to provide cascading binary-weighted stages.

In a number of teachings, the present disclosure relates to a method for routing radio-frequency (RF) signals. The method includes performing a switching operation in a switch network to allow passage of one or more RF signals through one or more corresponding switchable radio-frequency (RF) signal paths, with each path contributing to a parasitic effect associated with the switch network. The method further includes compensating for the parasitic effect at a node of the switch network.

According to some implementations, the present disclosure relates to a method for fabricating a switching apparatus. The method includes forming or providing a switch network that includes one or more switchable radio-frequency (RF) signal paths, with each path contributing to a parasitic effect associated with the switch network. The method further includes forming a parasitic compensation circuit, and coupling the parasitic compensation circuit to a node of the switch network, with the parasitic compensation circuit being configured to compensate for the parasitic effect of the switch network.

In a number of implementations, the present disclosure relates to a radio-frequency (RF) module that includes a packaging substrate configured to receive a plurality of components, and a switch network implemented on the packaging substrate. The switch network includes one or more switchable radio-frequency (RF) signal paths, where each path contributes to a parasitic effect associated with the switch network. The RF module further includes a parasitic compensation circuit implemented on the packaging substrate. The parasitic compensation circuit is coupled to a node of the switch network, and is configured to compensate for the parasitic effect of the switch network.

In some embodiments, the switch network is implemented on a first die such as a silicon-on-insulator (SOI) die. In some embodiments, at least a portion of the parasitic compensation circuit can be implemented on the first die, and at least a portion of the parasitic compensation circuit can be implemented on a second die. In some embodiments, the RF module can be an antenna switch module.

According to a number of teachings, the present disclosure relates to a radio-frequency (RF) device that includes a transceiver configured to process RF signals, and an antenna switch module (ASM) in communication with the transceiver. The ASM is configured to route amplified RF signals for transmission and received RF signals for amplification. The ASM includes a switch network having one or more switchable RF signal paths, with each path contributing to a parasitic effect associated with the switch network. The ASM further includes a parasitic compensation circuit coupled to a node of the switch network. The parasitic compensation circuit is configured to compensate for the parasitic effect of the switch network. The RF device further includes an antenna in communication with the ASM. The antenna is configured to facilitate either or both of transmission and reception of the respective RF signals. In some embodiments, the RF device can be a wireless device such as a cellular phone.

In accordance with a number of implementations, the present disclosure relates to an adjustable compensation circuit for a radio-frequency (RF) circuit. The adjustable compensation circuit includes an inductive circuit that couples a selected node of the RF circuit with a reference node, and is configured to provide a plurality of inductance values.

In some embodiments, the inductive circuit can include a plurality of switchable inductors connected in series. Each switchable inductor can include an inductor and a switch arranged in parallel. In some embodiments, each inductor of the inductive circuit can have a substantially constant inductance value of L0, such that the inductive circuit is capable of providing inductance values from L0 to a total inductance in steps of L0, with the total inductance being approximately equal to L0 times the number of the switchable inductors connected in series. In some embodiments, the inductive circuit can include a number of cascading binary-weighted stages that are independently switchable.

In some embodiments, the RF circuit can include a switch network having a plurality of switchable RF signal paths, and the reference node can be a ground node. The selected node of the RF circuit can be a common node, such as an antenna port, for the plurality of switchable RF signal paths.

In some embodiments, each of the plurality of switchable RF signal paths can include a series arm switch configured to connect the common node and its respective path node in an ON state, and disconnect the common node from its respective path node in an OFF state. Each of the plurality of switchable RF signal paths can further include a shunt arm switch configured to connect its respective path node to a ground when the corresponding series switch arm is in the OFF state, and disconnect the path node from the ground when the series switch arm is in the ON state. Each series arm switch can include a stack of transistor devices, with each transistor device having an off-capacitance Coff that increases with its size, and each shunt arm switch can include a stack of transistor devices, with each transistor device having an off-capacitance Coff that increases with its size. Each transistor device of the series arm switch can include N field-effect transistor(s) (FET(s)) arranged in a parallel configuration, and each transistor device of the shunt arm switch can include M FET(s) arranged in a parallel configuration, each of N and M being a positive integer.

In some embodiments, at least one of the plurality of inductance values provided by the adjustable compensation circuit can include an inductance value L that compensates for a parasitic effect resulting from the off-capacitances of the series arm switches and the shunt arm switches. The inductance L can be selected to have a value of $L=1/[4\pi^2 f^2 (C_{off\_total})]$, with the quantity f being an operating frequency, and the quantity Coff_total being a total off-capacitances of the switch network. The presence of the inductance L can allow either or both of series arm and shunt arm switch transistors to be sized larger to improve switch performance while reducing the parasitic effect of the off-capacitances of the series arm switches and the shunt arm switches.

The switch performance can include insertion loss performance. The sizes of both of the series arm and shunt arm switch transistors can be larger than corresponding transistors of a switching architecture without the inductance L. The switch network of the switching architecture with the inductance L can have a lower insertion loss than that of the switching architecture without the inductance L.

The switch performance can include isolation performance. The size of the shunt arm switch transistor can be larger than a corresponding transistor of a switching architecture without the inductance L. The switch network of the switching architecture with the inductance L can have a higher isolation than that of the switching architecture without the inductance L.

In accordance with some teachings, the present disclosure relates to a method for compensating for a parasitic effect associated with a radio-frequency (RF) switch network. The method includes performing a switching operation in the RF switch network to allow passage of one or more RF signals through one or more corresponding switchable RF signal paths, with each path contributing to the parasitic effect associated with the RF switch network. The method further includes providing an inductance with an adjustable compensation circuit coupled to a selected node of the RF switch network. The inductance is selected to compensate for the parasitic effect associated with the RF switch network.

In a number of implementations, the present disclosure relates to a method for fabricating a switching apparatus. The method includes forming or providing a switch network that includes one or more switchable radio-frequency (RF) signal paths, with each path contributing to a parasitic effect associated with the switch network. The method further includes forming an adjustable compensation circuit that includes an inductive circuit configured to provide a plurality of inductance values. The method further includes coupling the adjustable compensation circuit between a selected node of the switch network and a reference node, with the adjustable compensation circuit being configured to compensate for the parasitic effect of the switch network.

According to some implementations, the present disclosure relates to a radio-frequency (RF) module that includes a packaging substrate configured to receive a plurality of components, and a switch network implemented on the packaging substrate. The switch network includes one or more switchable radio-frequency (RF) signal paths, with each path contributing to a parasitic effect associated with the switch network. The RF module further includes an adjustable compensation circuit implemented on the packaging substrate and including an inductive circuit that couples a selected node of the switch network with a reference node. The inductive circuit is configured to provide a plurality of inductance values, with at least some of the inductance values being selected to compensate for the parasitic effect of the switch network.

In some embodiments, the switch network can be implemented on a first die such as a silicon-on-insulator (SOI) die. In some embodiments, at least a portion of the adjustable compensation circuit is implemented on the first die, and at least a portion of the adjustable compensation circuit can be implemented on a second die. In some embodiments, the RF module can be, for example, an antenna switch module.

In some implementations, the present disclosure relates to a radio-frequency (RF) device that includes a transceiver configured to process RF signals, and an antenna switch module (ASM) in communication with the transceiver. The ASM is configured to route amplified RF signals for transmission and received RF signals for amplification, and includes a switch network. The switch network includes one or more switchable RF signal paths, with each path contributing to a parasitic effect associated with the switch network. The ASM further includes an adjustable compensation circuit having an inductive circuit that couples a selected node of the switch network with a reference node. The inductive circuit is configured to provide a plurality of inductance values, with at least some of the inductance values being selected to compensate for the parasitic effect of the switch network. The RF device further includes an antenna in communication with the ASM. The antenna is configured to facilitate either or both of transmission and reception of the respective RF signals. In some embodiments, the RF device can be a wireless device such as a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/737,455, titled "CIRCUITS AND METHODS RELATED TO ADJUSTABLE COMPENSATION FOR PARASITIC EFFECTS IN RADIO-FREQUENCY SWITCH NETWORKS," filed on even date herewith and hereby incorporated by reference herein in its entirety.

BRIEF DESCRIPTION OF THE DRAWINGS

FIG. 4 shows an example where a switching network includes switches implemented in a stack configuration.

FIG. 5 depicts a switching network in terms of on-resistance (Ron) and off-capacitance (Coff) for the example configuration of FIG. 4, and in the example switching states of FIG. 3.

FIG. 8 shows an example of a switching architecture where a parasitic compensation circuit can include an inductance L configured to reduce the effects of off-capacitances (Coffs) of the various switches of a switch network.

FIG. 9 shows the switching architecture of FIG. 8 in terms of Ron and Coff.

FIG. 16 shows a switching architecture where a parasitic compensation circuit includes an adjustable inductance circuit.

FIG. 17 shows the switching architecture of FIG. 16 in terms of Ron and Coff.

DETAILED DESCRIPTION OF SOME EMBODIMENTS

The headings provided herein, if any, are for convenience only and do not necessarily affect the scope or meaning of the claimed invention.

Described herein are architectures and methods related to improved performance in switch designs that can be implemented in, for example, radio-frequency (RF) applications. Although described in the context of RF applications, it will be understood that one or more features of the present disclosure can also be utilized in other types of switching applications.

In RF systems, switches can be utilized used to turn on or off certain bands to facilitate receiving and/or transmitting functions. As more frequency bands are added to already existing bands, the usage of switches has been dramatically increased recently. However, due to process limitations of switch designs, existing switches can have undesirable insertion loss and limited isolation performance.

For example, many RF switches are implemented in stack configurations utilizing process technologies such as silicon-on-insulator (SOI). In such a stack configuration, a number of switching transistors can be connected in series so as to provide, for example, power handling capability. A switch having a stack of switching transistors can be implemented along a signal path, and such a switch is often referred to as a series arm, series arm switch, and the like. A switch having a stack of switching transistors can also be implemented along a shunt from the signal path, and such a switch is often referred to as a shunt arm, shunt arm switch, and the like. Series arm switches and shunt arm switches may or may not be configured the same.

Switches implemented in the foregoing manner can be utilized in RF applications such as routing of RF signals. For example, a common port such as an antenna port can be coupled to a plurality of signal paths through a switching network so as to allow operation of one or more paths in various operating modes. Such modes can include, for example, carrier-aggregation (CA) modes and non-CA modes. In another example, a common port such as an input port for a broadband low-noise amplifier (LNA) can be coupled to a plurality of signal paths through a switching network so as to allow operation of one or more paths in various operating modes. Similarly, such modes can include, for example, carrier-aggregation (CA) modes and non-CA modes. In both of the foregoing examples, the switching network preferably should have performance features such as low insertion loss and high isolation.

In the foregoing RF applications, as well as in other switching applications, sizes (e.g., in terms of W/L as described herein) of the switching transistors can be increased to improve insertion loss and isolation performance. However, such increases in device sizes can result in an undesirable increase in parasitic effects such as parasitic capacitance.

Figure 1:
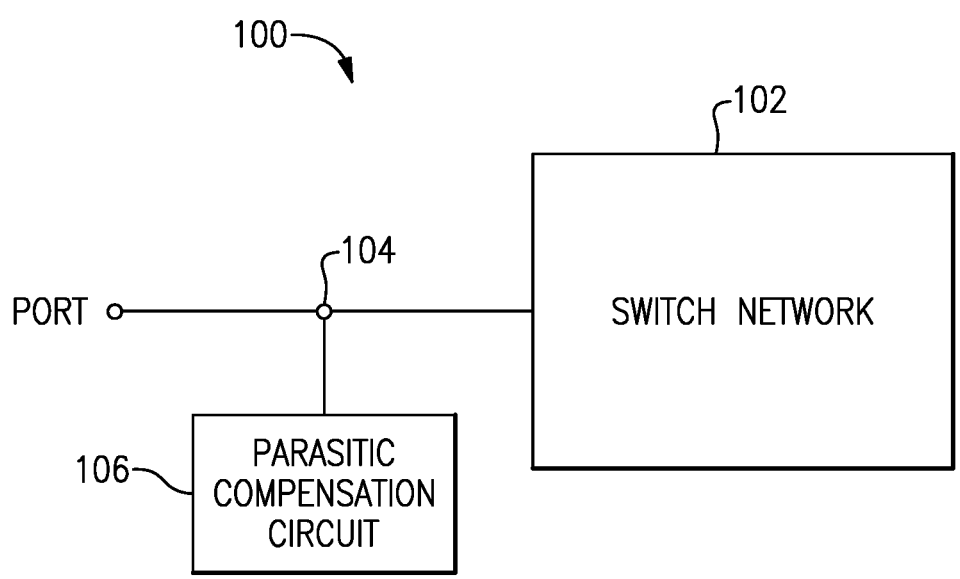
FIG. 1 shows a block diagram of a switching architecture having a switching network coupled to a port.

FIG. 1 shows a block diagram of a switching architecture 100 having a switching network 102 coupled to a port (node 104). Although not shown in FIG. 1, the other side of the switch network 102 can be coupled to one or more ports. Various examples are described herein in the context of the other side of the switch network 102 having a plurality of ports corresponding to a plurality of RF signal paths. However, it will be understood that one or more features of the present disclosure can also be implemented for a switching network having one path. Further, it will be understood that the switching network may 102 have more complex path designs than a plurality of parallel paths. For example, a given path coupled to the port node 104 can split into a plurality of paths.

FIG. 1 shows that the switching architecture 100 can further include a parasitic compensation circuit 106. As described herein, such a circuit can be configured to, for example, compensate for an increase in parasitic capacitance associated with an increase in device sizes (W/L). Various non-limiting examples of such a circuit are described herein in greater detail.

In FIG. 1, the parasitic compensation circuit 106 is depicted as being on the side of the port node 104. However, it will be understood that one or more parasitic compensation circuits can also be implemented on the other side of the switching network 102 along with the shown circuit 106, without the circuit 106, or any combination thereof.

Figure 2:
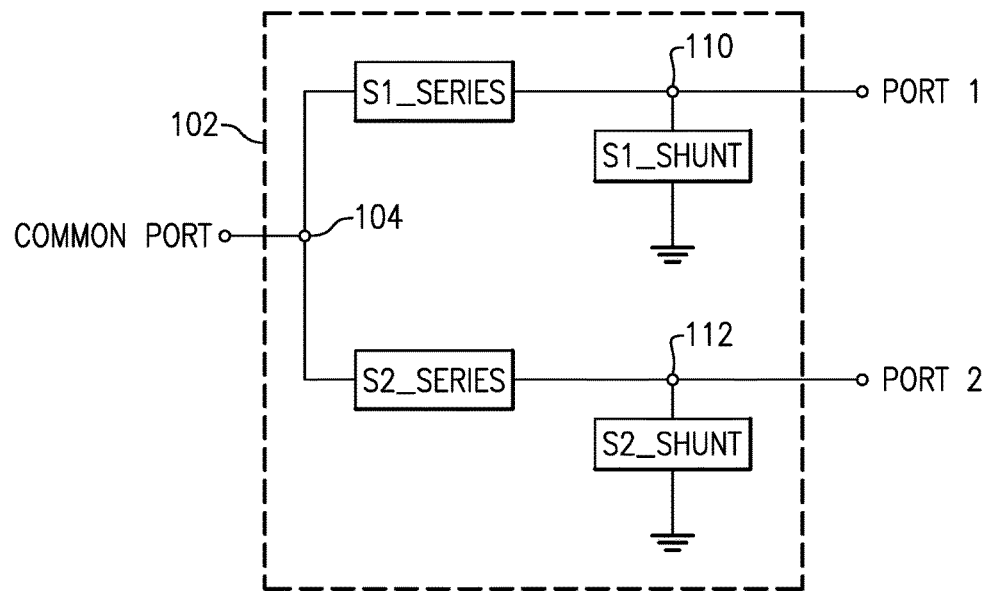
FIG. 2 shows an example of a switching network configured to merge a plurality of radio-frequency (RF) signal paths to a common port.

FIG. 2 shows an example of a switching network 102 configured to merge a plurality of RF signal paths to a common port. A first path from Port1 is shown to be coupled to node 104 of the common port through a first series arm switch S1_series. Similarly, a second path from Port2 is shown to be coupled to the common node 104 through a second series arm switch S2_series. Each of the first and second paths is shown to include a shunt path to, example, a ground. A first shunt path is shown to couple node 110 of Port1 to ground through a first shunt arm switch S1_shunt. Similarly, a second shunt path is shown to couple node 112 of Port2 to ground through a second shunt arm switch S2_shunt. A given shunt path can be turned on whenever the corresponding RF signal path is turned off so as to provide higher isolation between, for example, the corresponding port and the common port.

Figure 3:
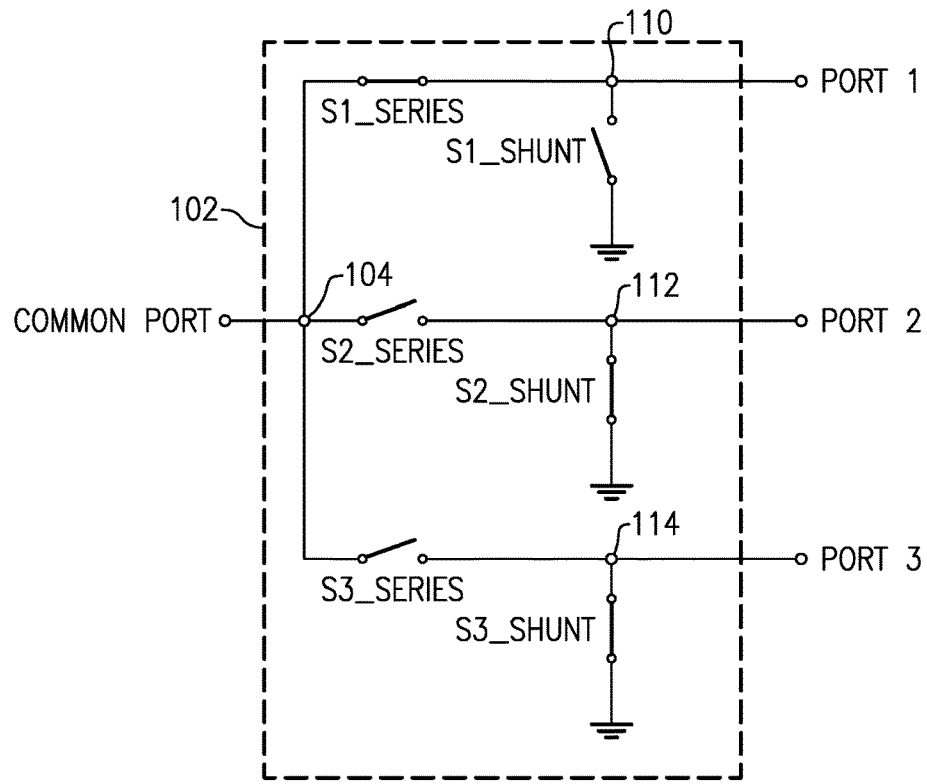
FIG. 3 shows an example of a shunt path being turned on when a corresponding RF signal path is turned off.

FIG. 3 shows an example of the foregoing shunt path being turned on whenever the corresponding RF signal path is turned off. In FIG. 3, there are three RF signal paths corresponding to Port1, Port2, Port3 coupled to a common port node 104; and the series arm switches and the shunt arm switches corresponding to such paths are depicted as single-pole-single-throw (SPST) switches. The first signal path is shown to be turned on by the first series arm switch S1_series being in a closed state, so as to connect Port1 to the common node 104. Each of the second and third signal paths is shown to be turned off by its respective series arm switch (S2_series or S3_series) being in an open state, so as to disconnect its respective port (Port2 or Port3) from the common node 104.

In the first signal path which is turned on, the corresponding shunt arm switch S1_shunt is shown to be in an open state so as to disconnect node 110 from ground. In each of the second and third signal paths which is turned off, the corresponding shunt arm switch (S2_shunt or S3_shunt) is shown to be in a closed state so as to connect its respective node (112 or 114) to ground. Thus, in the example of FIG. 3, the first signal path is active between Port1 and the common port, while each of the second and third signal paths is inactive. In each of the inactive paths (second and third signal paths), the corresponding shunt arm switch (S2_shunt of S3_shunt) being closed allows signal and/or noise present at the corresponding port (Port2 or Port3) to be shunted to ground instead of possibly leaking through the open series arm switch (S2_series or S3_series).

In some embodiments, each of the series arm and shunt arm switches of FIG. 3 can be implemented in a stack configuration that includes a plurality of switching transistors arranged in series. FIG. 4 shows an example where a switching network 102 includes switches having such a stack configuration. In FIG. 4, there are three RF signal paths similar to the example of FIG. 3; however, it will be understood that other numbers of paths can be implemented. In FIG. 4, arrangements of the series arm switches and the shunt arm switches for the three signal paths are generally the same as in the example of FIG. 3. In FIG. 4, the common port of FIG. 3 is depicted as being an antenna port; however, it will be understood that other ports can be the common port of FIG. 3.

In FIG. 4, the first series arm switch S1_series is depicted as including a plurality of FETs 120 connected in series between Port1 and a common node 104 of the antenna port. Similarly, the second series arm switch S2_series is depicted as including a plurality of FETs 122 connected in series between Port2 and the common node 104 of the antenna port. Similarly, the third series arm switch S3_series is depicted as including a plurality of FETs 124 connected in series between Port3 and the common node 104 of the antenna port. For the purpose of description, it will be understood that each of the three series arm switches includes the same number of FETs, with each FET having W/L dimensions. However, it will be understood that such series arms having the same configuration is not a requirement.

Similarly, in FIG. 4, the first shunt arm switch S1_shunt is depicted as including a plurality of FETs 130 connected in series between Port1 and ground. The second shunt arm switch S2_shunt is depicted as including a plurality of FETs 132 connected in series between Port2 and ground. The third shunt arm switch S3_shunt is depicted as including a plurality of FETs 134 connected in series between Port3 and ground. For the purpose of description, it will be understood that each of the three shunt arm switches includes the same number of FETs, with each FET having W/L dimensions. However, it will be understood that such shunt arms having the same configuration is not a requirement. It will be understood that the numbers of FETs associated with the series arm switches and the shunt arm switches may or may not be the same. Similarly, W/L dimensions associated with the series arm switches and the shunt arm switches may or may not be the same.

A switching network configured in the foregoing example manner can yield on-resistance (Ron) and off-capacitance (Coff) properties for the various switches. Typically, when a given stack-configuration switch is turned on, its on-resistance (Ron) is preferably low so as to reduce or minimize loss of power for an RF signal passing through the switch. When a given stack-configuration switch is turned off, its off-capacitance (Coff) is preferably low so as to reduce or minimize parasitic effects.

FIG. 5 depicts a switching network 102 in terms of Ron and Coff for the example configuration of FIG. 4, and in the example switching states of FIG. 3. Thus, the first series arm switch S1_series, which is on, is shown to have an on-resistance of Ron_series. Similarly, each of the second and third shunt arm switches (S2_shunt, S3_shunt), which is on, is shown to have an on-resistance of Ron_shunt. As described herein, on-resistances (Rons) among the series arm switches may or may not be the same. Similarly, on-resistances (Rons) among the shunt arm switches may or may not be the same.

The first shunt arm switch S1_shunt, which is off, is shown to have an off-capacitance of Coff_shunt. Similarly, each of the second and third series arm switches (S2_series, S3_series), which is off, is shown to have an off-capacitance of Coff_series. As described herein, off-capacitances (Coffs) among the series arm switches may or may not be the same. Similarly, off-capacitances (Coffs) among the shunt arm switches may or may not be the same.

In the example of FIGS. 4 and 5, each arm, whether it be a series arm or a shunt arm, includes a number of devices connected in series. Accordingly, and assuming that each device has the same on-resistance as other devices in a given arm, the total on-resistance of that arm can be approximately the on-resistance of each device times the number of devices. Similarly, and assuming that each device has the same off-capacitance as other devices in a given arm, the total off-capacitance of that arm can be approximately the off-capacitance of each device divided by the number of devices.

It is also noted that for the purpose of description herein, Ron of a device is generally inversely proportional to the device size ratio W/L. Accordingly, when a given arm (whether it be a series arm or a shunt arm) is on, an increase in W/L of the device results in a decrease in the on-resistance of the arm. Further, Coff of a device is generally proportional to the device size ratio W/L. Accordingly, when a given arm (whether it be a series arm or a shunt arm) is off, an increase in W/L of the device results in an increase in the off-capacitance of the arm. Examples of device dimensions W and L are described in greater detail in reference to FIG. 6.

Figure 6B:
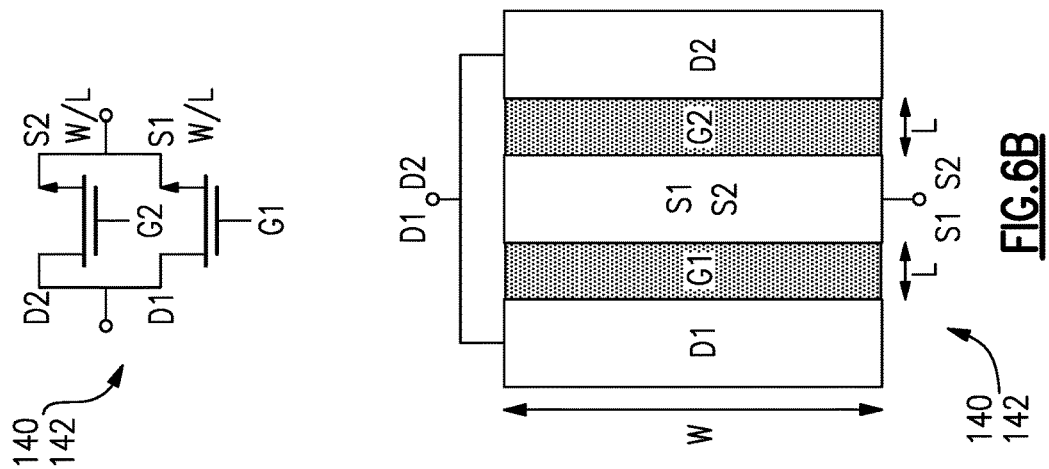
FIG. 6B shows an example circuit representation and an example layout of the switching device of FIG. 6A.
Figure 6A:
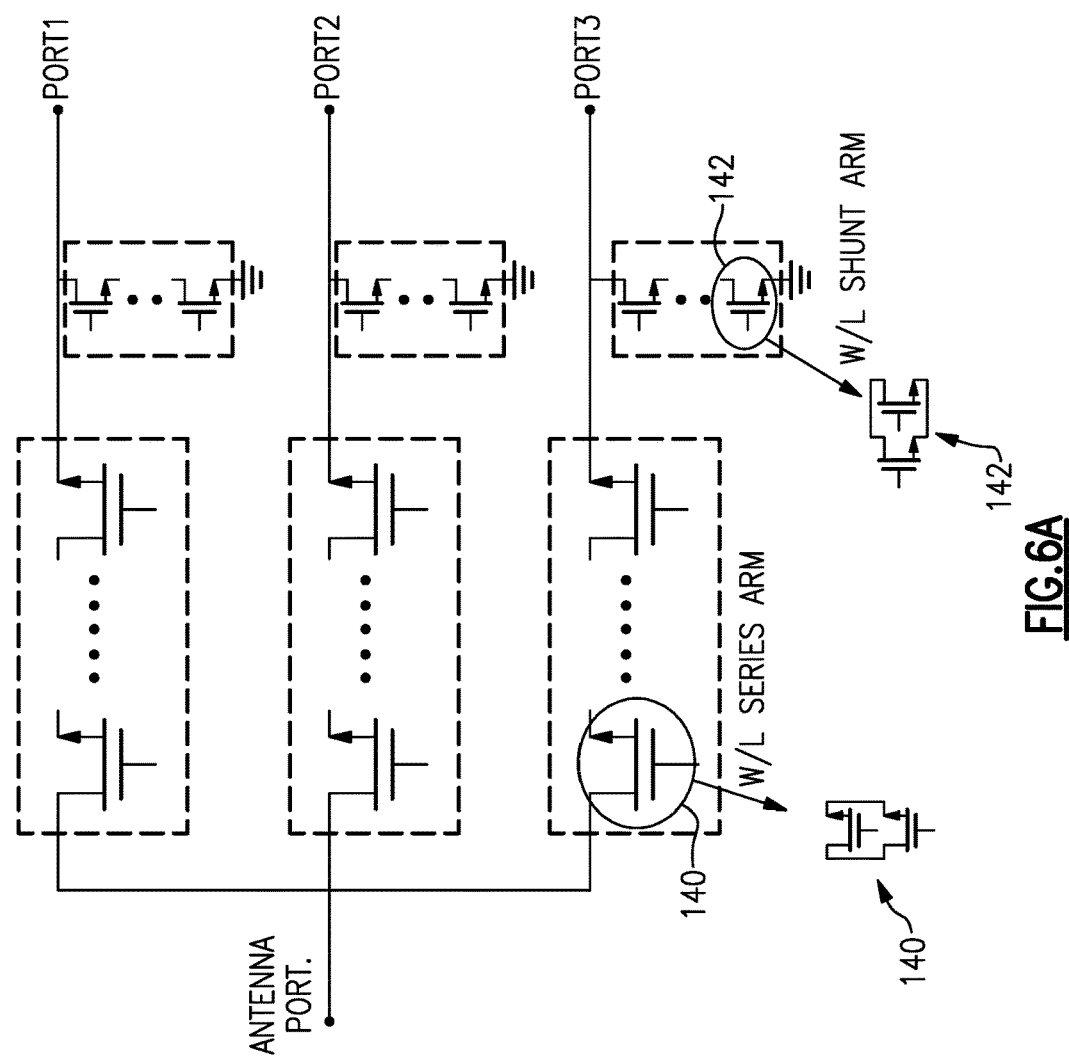
FIG. 6A shows that in some embodiments, each switching device can include a plurality of FETs arranged in a parallel configuration.

FIG. 6A shows a configuration that is similar to the example of FIG. 4. FIG. 6A further shows that in some embodiments, each device (e.g., 120, 122, 124, 130, 132 or 134) in FIG. 4 can include a plurality of FETs arranged in parallel configuration. For example, a device 140 in the series arm is shown to have two FETs connected in a parallel configuration. Similarly, a device 142 in the shunt arm is shown to have two FETs connected in a parallel configuration. It will be understood that such devices in the series arm (e.g., 140) and/or the shunt arm (e.g., 142) can include more or less number of FETs.

FIG. 6B shows a circuit representation of the device (140 or 142) with the two example FETs, as well as an example layout of the same. In the example of FIG. 6B, the drain D1 of the first FET and the drain D2 of the second FET are connected at a common node. Similarly, the source S1 of the first FET and the source S2 of the second FET are connected at a common node. Accordingly, the first and the second FETs are electrically parallel between the common drain node and the common source node. The gate G1 of the first FET and the gate G2 of the second FET may or may not be controlled together.

In the example layout of FIG. 6B, two gate fingers indicated as G1 and G2 arranged on an active area can yield the two-FET configuration. The region left of the first gate G1 can function as D1, and the region right of the second gate can function as D2, such that the two drains D1, D2 are connected at the common node D1 D2. The region between the first gate G1 and the second gate G2 can function as a common source S1 S2, and such a common source is shown to be connected to the common node S1 S2. It will be understood that the source and drain designation can be reversed.

In the example layout of FIG. 6B, the dimension W is indicated as the width of the active region, and the dimension L is indicated as the length of each gate. Accordingly, it will be understood that various references to the ratio W/L herein can refer to such an arrangement. It will also be understood that one or more features of the present disclosure can also apply even if dimension parameters are formulated in other manners.

In reference to FIG. 6B, it is noted that similar layouts can be implemented for a device have more or less number of FETs. For example, if the device has one FET, the layout can include a gate (G1) between a drain (D1) and a source (S1), with the source and the drain being connected to their respective nodes. In another example, if the device has three FETs, the example layout of FIG. 6B can be extended to include a third gate (G3) to the right of D2, followed by a source region (S2 S3) to the right of G3. For such an example, the two drain regions (D1, D2) can be connected to a common node, and the two source regions (S1 S2 and S2 S3) can be connected to a common node.

Figure 7:
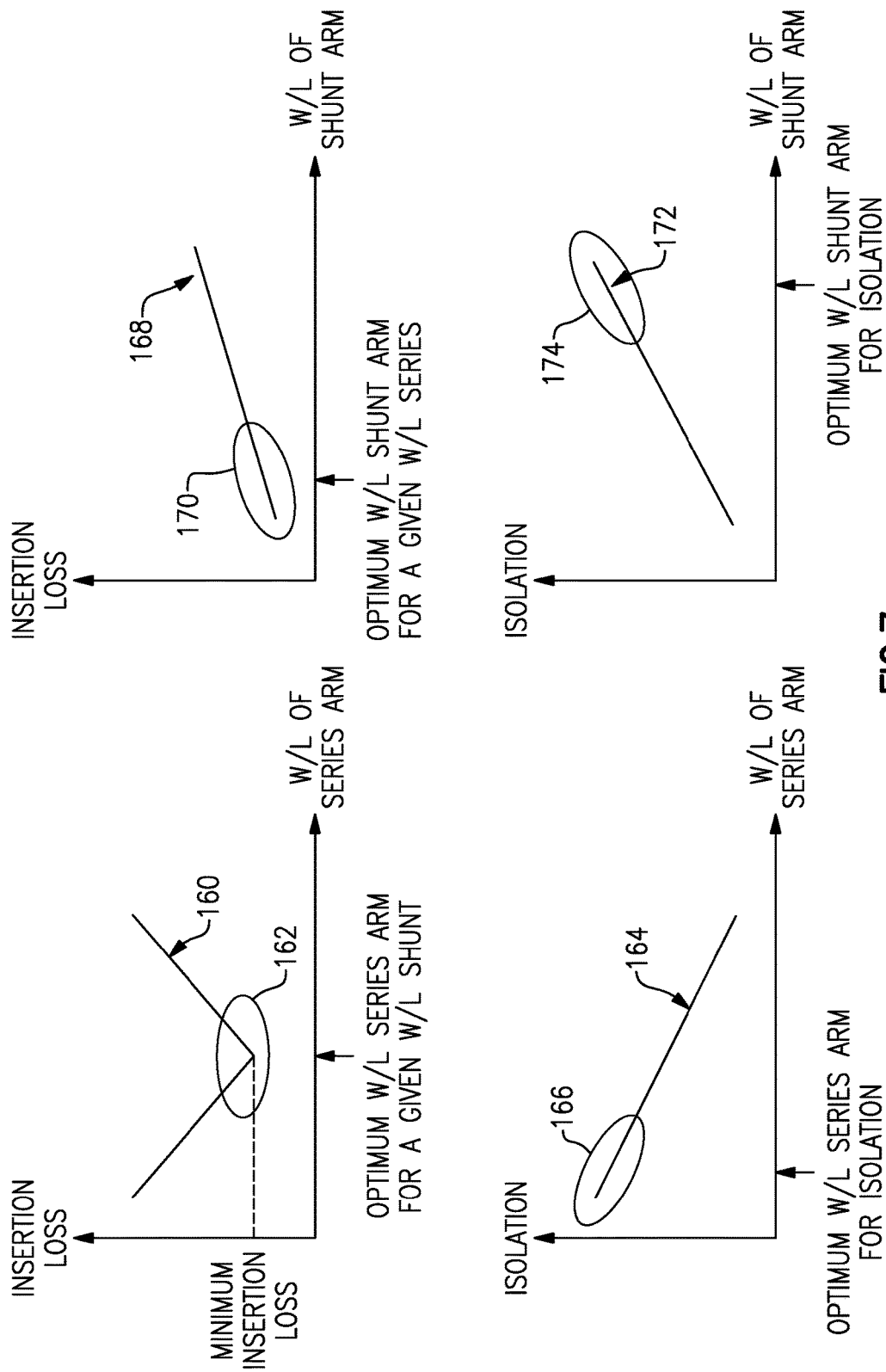
FIG. 7 shows examples of insertion loss and isolation properties for the switches of FIGS. 4-6.

FIG. 7 shows examples of insertion loss and isolation properties for the switches described in reference to FIGS. 4-6. The upper left panel shows a plot 160 of insertion loss of the switch network (102 in FIGS. 4 and 5) as a function of W/L of series arm. The upper right panel shows a plot 168 of insertion loss of the switch network 102 as a function of W/L of shunt arm. The lower left panel shows a plot 164 of isolation of the switch network 102 as a function of W/L of series arm. The lower right panel shows a plot 172 of isolation of the switch network 102 as a function of W/L of shunt arm.

As shown in the upper left panel, for a given W/L shunt value, the insertion loss of the switch network 102 generally decreases to a minimum insertion loss value as W/L of series arm increases. However, as W/L of series arm continues to increase, the insertion loss of the switch network 102 increases, due to, for example, frequency response from an increase in Coff_series that loads the signal path and thereby results in an increased leakage into other paths. Accordingly, a region indicated as 162 includes an optimum or desired value for W/L of series arm corresponding to the minimum insertion loss, for the given W/L shunt value.

As shown in the upper right panel, for a given W/L series value, the insertion loss of the switch network 102 generally increases as W/L of shunt arm increases. Such an increase can be due to, for example, frequency response from an increase in Coff_shunt that loads the corresponding signal path and thereby results in an increased leakage. Accordingly, a region indicated as 170 includes an optimum or desired value for W/L of shunt arm, for the given W/L series value.

As shown in the lower left panel, for a given W/L shunt value, the isolation level of the switch network 102 generally decreases as W/L of series arm increases. Accordingly, a region indicated as 166 includes an optimum or desired value for W/L of series arm to yield a high isolation level, for the given W/L shunt value.

As shown in the lower right panel, for a given W/L series value, the isolation level of the switch network 102 generally increases as W/L of shunt arm increases. Accordingly, a region indicated as 174 includes an optimum or desired value for W/L of shunt arm to yield a high isolation level, for the given W/L series value.

It is noted that sizes of W/L series and W/L shunt that yield optimum values of insertion loss and optimum isolation are generally different. Accordingly, such performance parameters can be considered individually or in some combination to yield a desired overall performance of the switch network.

As described herein, increase in sizes of the switches can be beneficial; however, such a size increase typically results in increase in off-capacitances. As described in reference to FIG. 7, both of the off-capacitances (Coffs) of the series arm switches and the shunt arm switches can contribute to the degradation of insertion loss performance. Based on the foregoing, reducing the effects of such off-capacitances of the switches can be beneficial, since such a reduction allows a given switch size to increase to larger value for a given level of parasitic effect.

FIG. 8 shows an example of a switching architecture 100 where a parasitic compensation circuit 106 can include an inductance L configured to reduce the effects of off-capacitances (Coffs) of the various switches of a switch network 102. In FIG. 8, the arrangement of the series arm switches (S1_series, S2_series, S3_series) and the shunt arm switches (S1_shunt, S2_shunt, S3_shunt) in the switch network 102 are generally the same as in the example of FIG. 4. However, the W/L sizes of such switches may or may not be the same as in the example of FIG. 4. For example, because of the presence of the parasitic compensation circuit 106, W/L sizes of either or both of the series and shunt arm switches can be larger than in the example of FIG. 4.

More particularly, each series arm switch can include a stack of devices, with each device having a size characterized by W/L. It will be understood that each device in the series arm switch can include one FET, or N FETs arranged in a parallel configuration as described in reference to FIGS. 6A and 6B. Similarly, each shunt arm switch can include a stack of devices, with each device having a size characterized by W/L. It will also be understood that each device in the shunt arm switch can include one FET, or M FETs arranged in a parallel configuration as described in reference to FIGS. 6A and 6B. Although W/L is used to describe both of the series and shunt arm switches, it will be understood that their respective sizes may or may not be the same.

In the example of FIG. 8, the inductance L of the parasitic compensation circuit 106 is shown to couple the antenna node 104 with ground. As described herein, the value of L can be selected to reduce the effects of off-capacitances associated with the switch network 102 for a selected value or range of frequency.

FIG. 9 shows the switching architecture of FIG. 8, where the switching network 102 is depicted in terms of Ron and Coff, in the example switching states of FIG. 3. Thus, the first series arm switch S1_series, which is on, is shown to have a total on-resistance of Ron_series/N, where N is a positive integer. When N=1, each device in the series arm switch has one FET; and when N>1, each device has N FETs arranged in a parallel configuration. Similarly, each of the second and third shunt arm switches (S2_shunt, S3_shunt), which is on, is shown to have a total on-resistance of Ron_shunt/M, where M is a positive integer. When M=1, each device in the shunt arm switch has one FET; and when M>1, each device has M FETs arranged in a parallel configuration.

The first shunt arm switch S1_shunt, which is off, is shown to have a total off-capacitance of Coff_shunt×M, with M being a positive integer as described above. Similarly, each of the second and third series arm switches (S2_series, S3_series), which is off, is shown to have a total off-capacitance of Coff_series×N, with N being a positive integer as described above.

Figure 10:
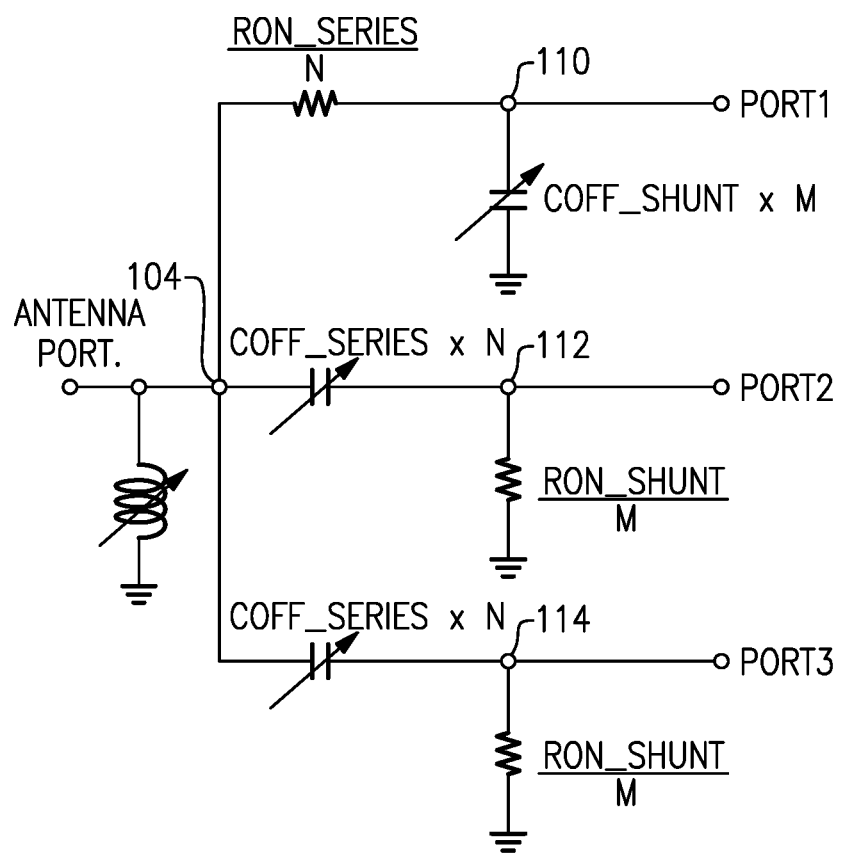
FIG. 10 shows that in some embodiments, the inductance L of the parasitic compensation circuit can be adjusted based on the off-capacitances (Coffs) of the various switches of the switch network.

FIG. 10 shows that in some embodiments, the inductance L of the parasitic compensation circuit 106 can be adjusted based on the off-capacitances (Coffs) of the various switches of the switch network. For example, one can obtain or estimate a total off-capacitance (Coff_total) of the switch network and estimate the value of L based on LC resonance frequency of $$f = \frac{1}{2\pi\sqrt{LC}},$$

such that $$L = \frac{1}{4\pi^2 f^2 (\text{Coff\_total})}, \quad (1)$$

where f is a frequency of interest.

In the example of FIG. 10, the value of Coff_total is based on the first signal path being turned on (between Port 1 and the antenna port) and the other two signal paths being turned off. Values of Coff_total can be based on other signal routing configurations; accordingly, corresponding values of L can be estimated for such configurations. In embodiments where all of the series arm switches are approximately the same and all of the shunt arm switches are approximately the same, one can see that one value of L can be estimated to compensate for Coff_total when any one path is turned on with the other path(s) turned off, for a given frequency of interest. Similarly, if any two paths are turned on (e.g., for carrier-aggregation) with the other path(s) turned off, one value of L can be utilized to compensate for Coff_total, for a given frequency of interest.

Figure 11:
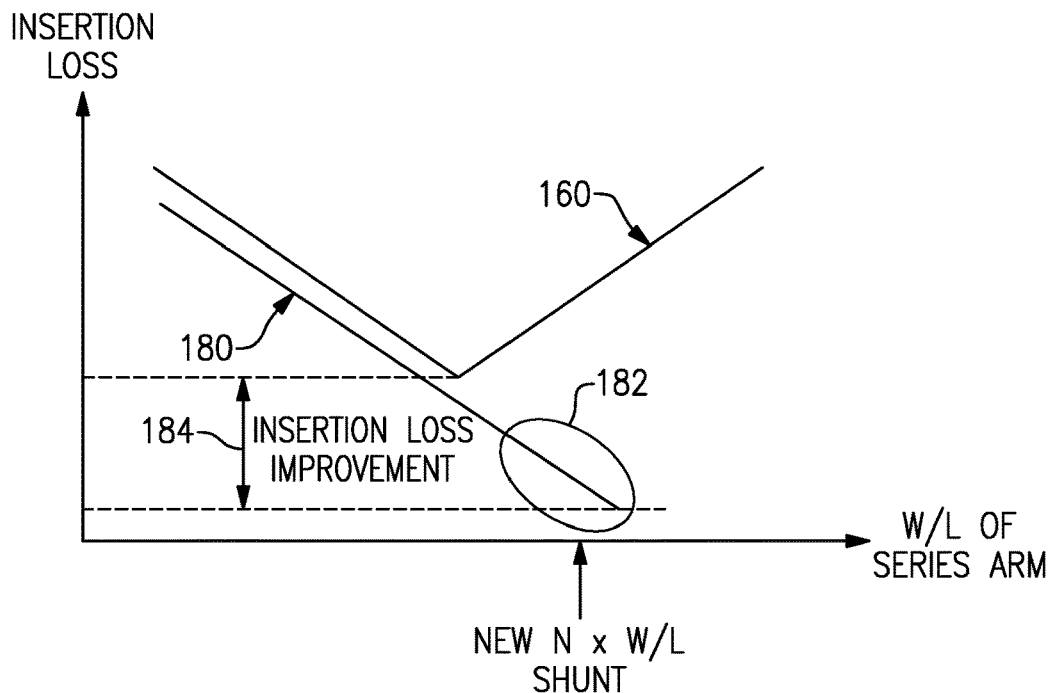
FIG. 11 shows an example of how insertion loss performance can be improved by increasing the size of a series arm switch while having its parasitic effect reduced or maintained by an inductance (L) of a parasitic compensation circuit having one or more features as described herein.
Figure 12:
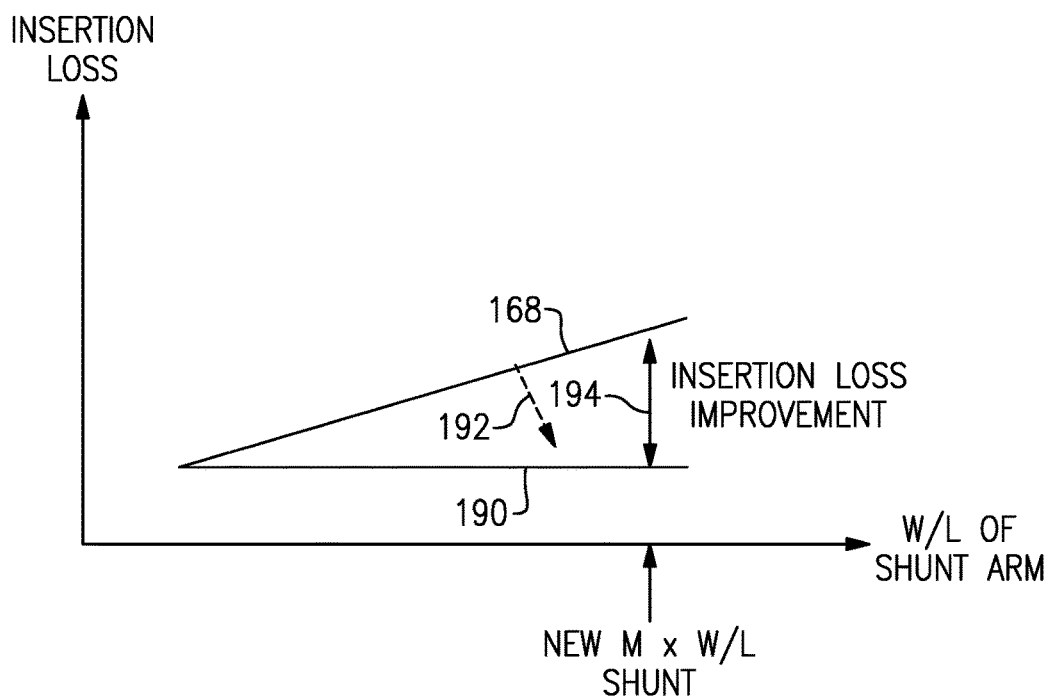
FIG. 12 shows an example of how insertion loss performance can be improved along a much larger range of the size of a shunt arm switch while having its parasitic effect reduced or maintained by an inductance (L) of a parasitic compensation circuit having one or more features as described herein.
Figure 13:
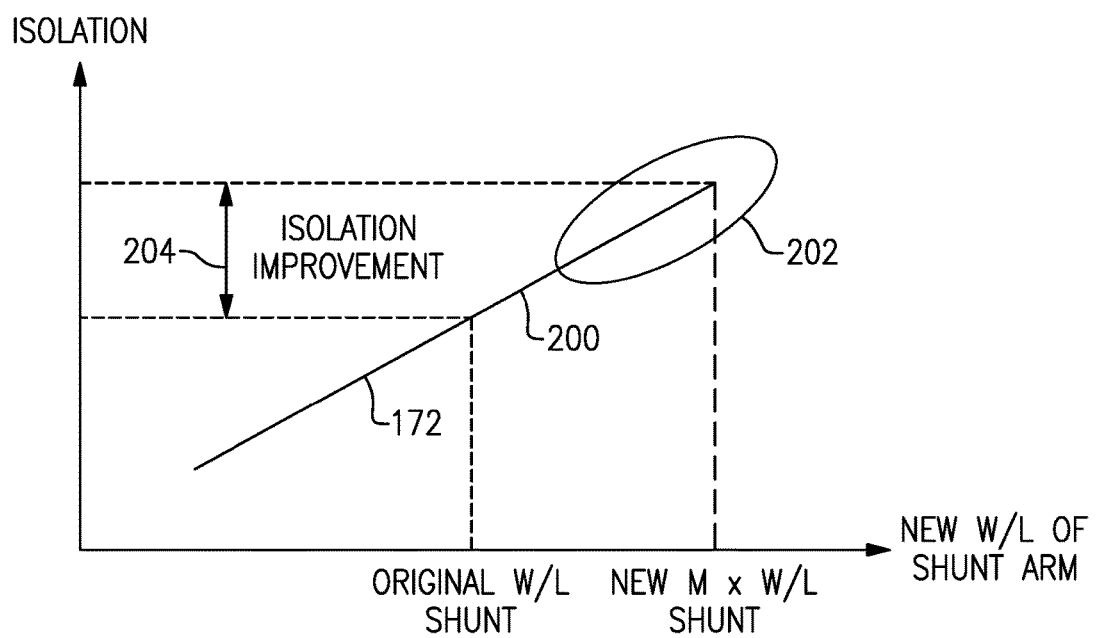
FIG. 13 shows an example of how isolation performance can be improved with larger sizes of a shunt arm switch.

As described herein (e.g., in reference to FIG. 7), beneficial effects of increasing the W/L sizes of switching transistors can be limited by the corresponding increase in parasitic capacitances. However, as described in reference to FIG. 10, such parasitic capacitances can be estimated and compensated for by providing an appropriately valued inductance at a common node such as an antenna port. FIGS. 11-13 show examples of how insertion loss performance and isolation performance can be improved with the use of such inductance.

FIG. 11 shows an example of how insertion loss performance can be improved by increasing the size of a series arm switch while having its parasitic effect reduced or maintained by an inductance (L) of a parasitic compensation circuit having one or more features as described herein. Insertion loss profile 160 (as a function of W/L of series arm) is similar to the example of the upper left panel of FIG. 7, and corresponds to a configuration without the parasitic compensation circuit. Such a profile includes a minimum insertion loss value (in region 162 in FIG. 7) as W/L of series arm is increased (for a given W/L of shunt arm), after which insertion loss increases due the parasitic capacitance effect.

In FIG. 11, insertion loss profile 180 (as a function of W/L of series arm) is for a configuration with the parasitic compensation circuit. One can see that because of the inductance L reducing the effect of the parasitic capacitance as described herein, a number of beneficial effects can be realized in the context of insertion loss. For example, one can see that the insertion loss profile 180 as a whole is generally lower than the insertion loss profile 160. In another example, the W/L of series arm can be increased (for a given W/L of shunt arm) to a larger value before a minimum is reached. Beyond such a minimum, the parasitic capacitance effect (if any) can begin to dominate and cause an increase in insertion loss, if W/L of series arm continues to increase.

In FIG. 11, such a new minimum or desired reduced insertion loss value is shown to be in a region indicated as 182, for a given shunt switch configuration (e.g., as in FIGS. 8-10). Accordingly, arrow 184 indicates an example improvement in insertion loss performance that can be obtained.

FIG. 12 shows an example of how insertion loss performance can be improved along a much larger range of the size of a shunt arm switch while having its parasitic effect reduced or maintained by an inductance (L) of a parasitic compensation circuit having one or more features as described herein. Insertion loss profile 168 (as a function of W/L of shunt arm) is similar to the example of the upper right panel of FIG. 7, and corresponds to a configuration without the parasitic compensation circuit. Such a profile includes a general increase in insertion loss as W/L of shunt arm is increased (for a given W/L of series arm).

In FIG. 12, insertion loss profile 190 (as a function of W/L of shunt arm) is for a configuration with the parasitic compensation circuit. One can see that the insertion loss profile 190 as a whole is generally lower than the insertion loss profile 168. Such a general decrease in insertion loss profile (depicted by arrow 192) is due to the inductance L reducing the effect of the parasitic capacitance as described herein. In the example shown, the W/L of shunt arm can be increased (for a given W/L of series arm) while maintaining a desired level of insertion loss. At the higher end of the W/L range, the improvement of the insertion loss performance (of profile 190) over the profile 168 is more pronounced, and such an example improvement is indicated by arrow 194.

FIG. 13 shows an example of how isolation performance can be improved with larger sizes of a shunt arm switch. Isolation profile 172 (as a function of W/L of shunt arm) is similar to the example of the lower right panel of FIG. 7, and corresponds to a configuration without the parasitic compensation circuit. Such a profile includes a general increase in isolation as W/L of shunt arm is increased (for a given W/L of series arm).

In FIG. 13, isolation profile 200 (as a function of W/L of shunt arm) is for a configuration with a parasitic compensation circuit having one or more features as described herein. One can see that the isolation profile 200 can allow the increasing trend of isolation to continue as W/L increases. Such a continued increase in isolation (due to increase in W/L of shunt arm) can be balanced with an increase in insertion loss. As described in reference to FIG. 12, larger values of W/L can be implemented while maintaining or reducing such an insertion loss. Accordingly, an upper limit in the increase in W/L of shunt arm can be extended to achieve increased isolation while maintaining or reducing the insertion loss. In FIG. 13, such an increased upper limit of the isolation performance (of profile 200) is indicated in region 202, and the resulting example improvement is indicated by arrow 204.

It is noted again that sizes of W/L series and W/L shunt that yield optimum or desired values of insertion loss and optimum isolation are generally different. Accordingly, such performance parameters can be considered individually or in some combination to yield a desired overall performance of the switch network.

Figure 14:
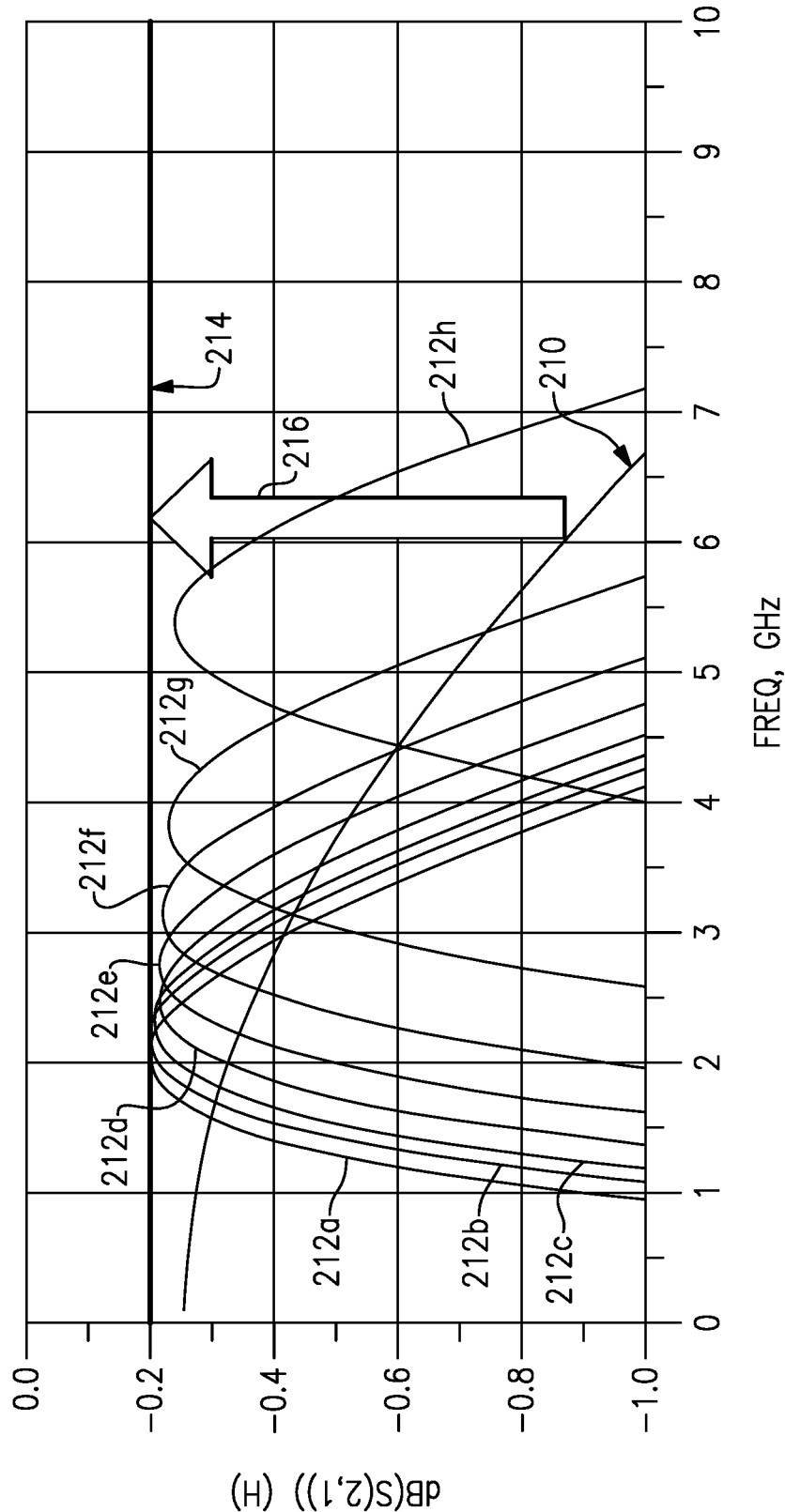
FIG. 14 shows insertion loss profiles corresponding to configurations with and without a parasitic compensation circuit, as a function of frequency.
Figure 15:
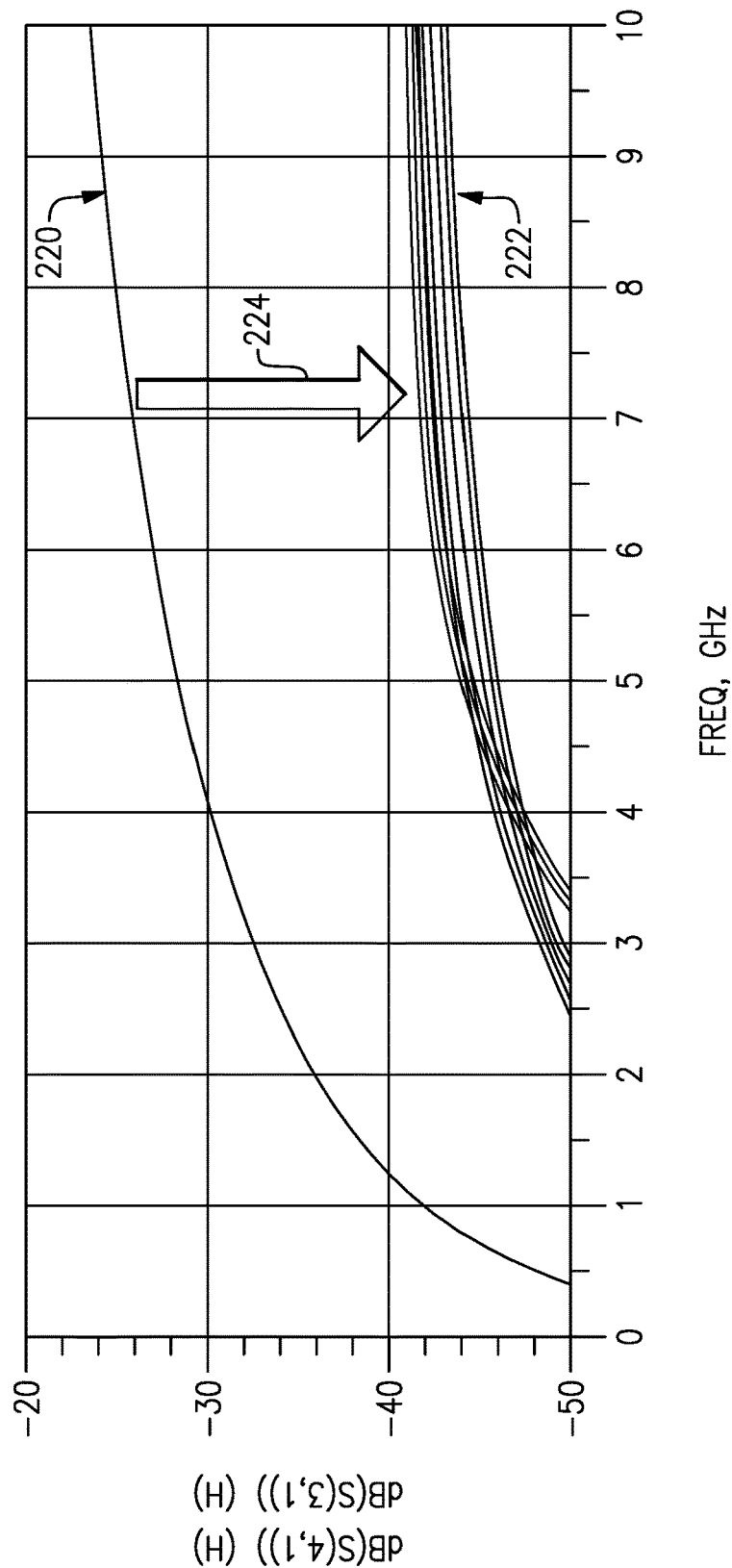
FIG. 15 shows isolation profiles corresponding to configurations with and without a parasitic compensation circuit, as a function of frequency.

FIGS. 14 and 15 show examples of simulation results demonstrating improvements in insertion loss performance and isolation performance that can be obtained by implementation of a parasitic compensation circuit as described herein. FIG. 14 shows insertion loss profiles corresponding to configurations with and without such a parasitic compensation circuit, as a function of frequency. FIG. 15 shows isolation profiles corresponding to the same configurations with and without such a parasitic compensation circuit, as a function of frequency. In both of the examples of FIGS. 14 and 15, a switch network includes three signal paths similar to the examples of FIGS. 4 and 8. Each series arm switch has a stack of devices, with each device having 2 FETs arranged in parallel (N=2). Each shunt arm switch has a stack of devices, with each device having 20 FETs arranged in parallel (M=20). Values of W/L for such transistors in the series arm and shunt arm switches correspond to various optimized values with the presence of the parasitic compensation circuit. For the configuration with the parasitic compensation circuit, the value of L varies from 1 nH to 8 nH in 1 nH step, and has a Q value of 30 at 2 GHz.

In FIG. 14, an insertion loss profile 210 corresponds to the foregoing configuration without the parasitic compensation circuit. As shown, the magnitude of insertion loss increases as frequency increases. Insertion loss profiles 212a-212h correspond to the foregoing configuration with the parasitic compensation circuit, with the eight curves corresponding to the eight example values of L. The left-most curve 212a corresponds to L=8 nH, the next curve 212b corresponds to L=7 nH, the next curve 212c corresponds to L=6 nH, the next curve 212d corresponds to L=5 nH, the next curve 212e corresponds to L=4 nH, the next curve 212f corresponds to L=3 nH, the next curve 212g corresponds to L=2 nH, and the right-most curve 212h corresponds to L=1 nH. One can see that with appropriate values of L, the insertion loss magnitude can be reduced to approximately 0.2 dB for a wide range of frequency. Such an insertion loss magnitude is indicated as 214. One can also see that the improvement over the configuration without the parasitic compensation circuit (curve 210) becomes larger as frequency increases. Such an improvement over the configuration without the parasitic compensation circuit (curve 210) is indicated by an arrow 216.

In FIG. 15, an isolation profile 220 (S(4,1)) corresponds to the foregoing configuration without the parasitic compensation circuit. As shown, the magnitude of isolation decreases as frequency increases. Isolation profiles 222 (S(3,1)) correspond to the foregoing configuration with the parasitic compensation circuit, with the eight curves corresponding to the eight example values of L. One can see that with any of the eight values of L, the isolation magnitude can be increased significantly for a wide range of frequency. Such an improvement over the configuration without the parasitic compensation circuit (curve 220) is indicated by an arrow 224.

As shown in the example of FIG. 14, implementation of different values of L in a parasitic compensation circuit can improve the insertion loss performance significantly over a relatively wide range of frequencies. In some applications, being able to provide such improved performance at different frequency values or ranges with the same parasitic compensation circuit can be desirable. In some embodiments, such a functionality can be provided by a variable inductance circuit such as a circuit having a plurality of switchable inductances.

FIG. 16 shows a switching architecture 100 that is similar to the example of FIG. 8. FIG. 17 shows the switching architecture of FIG. 16, where the switching network 102 is depicted in terms of Ron and Coff, in the example switching states of FIG. 3. Similar to the examples of FIGS. 8 and 9, a device in the series arm includes N FET(s) in parallel, with N being a positive integer; and a device in the shunt arm includes M FET(s) in parallel, with M being a positive integer.

In FIGS. 16 and 17, a parasitic compensation circuit 106 is shown include an inductance circuit that can provide different inductance values by switching operations. For example, K inductors (L1, L2, . . . , LK) are shown to be arranged in series between the antenna node 104 and ground. Each inductor and a corresponding switch (SL1, SL2, . . . , or SLK) are shown to be arranged in parallel. Accordingly, opening and/or closing of the switches (SL1, SL2, . . . , SLK) can yield an overall inductance L having a value from 0 (or close to 0) to L1+L2+ . . . +LK. More specific examples of such adjustable inductance circuits are described herein in greater detail. It will be understood that the individual inductance values (L1, L2, . . . , LK) may or may not be the same. It will also be understood that although described in the context of the inductors being arranged in series, the inductors can be arranged in other configurations. In some embodiments, the value K can be an integer greater or equal to 2.

Figure 18:
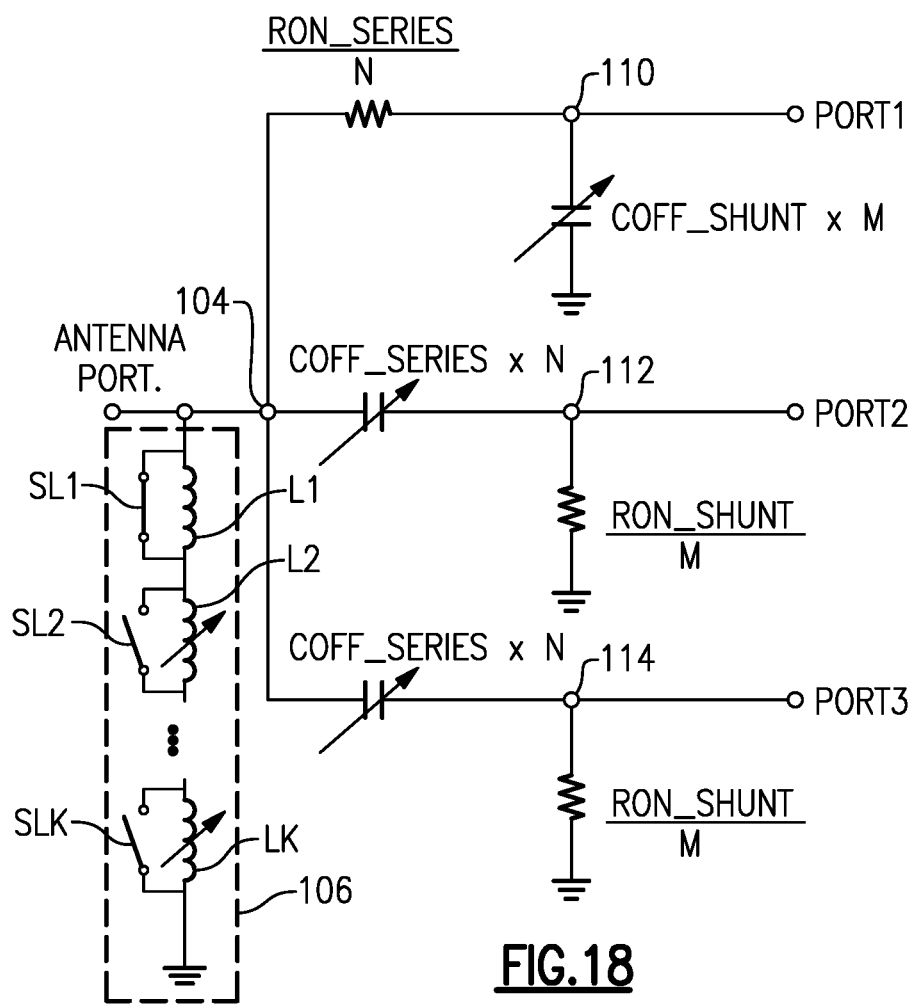
FIG. 18 shows that in some embodiments, the inductance L of the parasitic compensation circuit can be adjusted based on the off-capacitances (Coffs) of the various switches of the switch network.
Figure 19A:
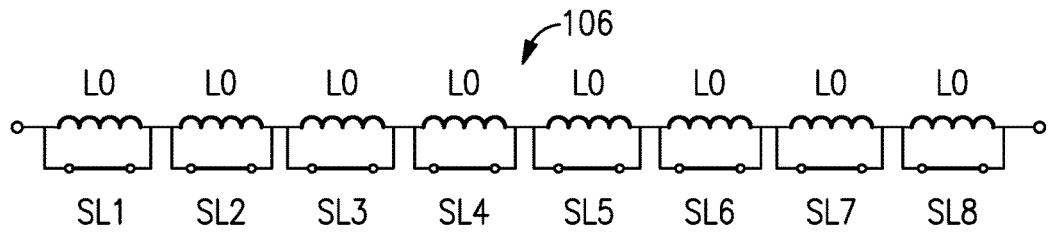
FIGS. 19A-19D show an example of a parasitic compensation circuit configured to provide different values of inductance L.
Figure 19B:
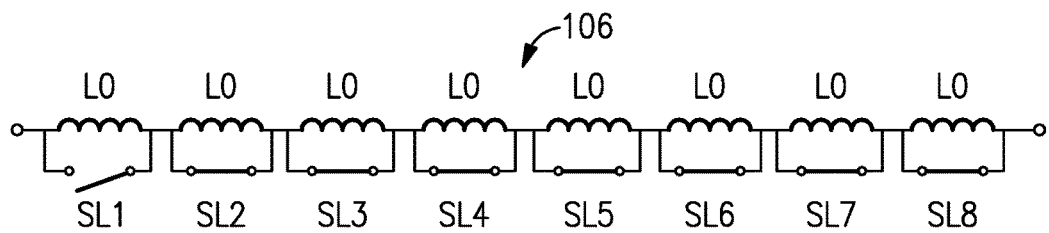
Figure 19C:
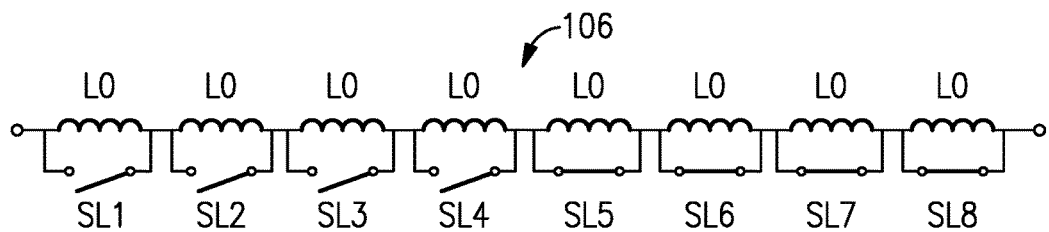
Figure 19D:
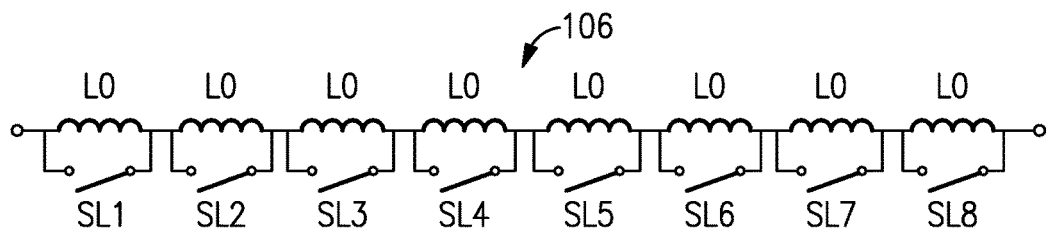

Similar to FIG. 10, FIG. 18 shows that in some embodiments, the inductance L of the parasitic compensation circuit 106 can be adjusted based on the off-capacitances (Coffs) of the various switches of the switch network. In FIG. 18, such adjustment of the inductance L can be achieved by the example inductance circuit described in reference to FIGS. 16 and 17.

FIGS. 19 and 20 show more specific examples of the parasitic compensation circuit 106 of FIGS. 16-18. In the example of FIG. 19, a parasitic compensation circuit 106 is shown to include eight inductors with each having an inductance of L0. Each inductor is shown to have a switch connected in parallel. Accordingly, a given inductor can provide its inductance of L0 when its switch is opened. When the switch is closed, that inductor is bypassed.

The foregoing chain of switched inductors can be implemented between a common node such as the antenna node of FIGS. 16-18 and ground, so as to provide variable inductances from 0 (or close to 0) to 8L0 (or close to 8L0) in steps of L0. Thus, if L0 has a value of 1 nH, the chain of switched inductors in the example parasitic compensation circuit 106 can provide the improved insertion loss performance as described in FIG. 14.

Within FIG. 19, four example states of the chain of switched inductors are shown. FIG. 19A shows a state where all of the eight switches (SL1 to SL8) are closed. Accordingly, each of the eight inductors is bypassed, thereby yielding an overall inductance L of approximately 0. FIG. 19B shows a state where one of the eight switches (e.g., SL1) is open and the remaining switches are closed. Accordingly, one inductor is active, and each of the remaining seven inductors is bypassed, thereby yielding an overall inductance L of approximately L0. FIG. 19C shows a state where four of the eight switches (e.g., SL1 to SL4) are open and the remaining switches are closed. Accordingly, four inductors are active, and each of the remaining four inductors is bypassed, thereby yielding an overall inductance L of approximately 4L0. FIG. 19D shows a state where all of the eight switches are open. Accordingly, all eight inductors are active, thereby yielding an overall inductance L of approximately 8L0.

FIG. 20 shows an example of a parasitic compensation circuit 106 having inductors with different values. Each inductor is shown to have a switch connected in parallel. Accordingly, a given inductor can provide its inductance when its switch is opened. When the switch is closed, that inductor is bypassed.

FIG. 20 shows that in some embodiments inductors having different values can be arranged in cascading binary-weighted stages that are independently switchable. In such a configuration, N stages can provide $2^N$ inductance states. For example, 3 stages can be implemented with L0, 2L0, and 4L0 inductance values. With such stages, $2^3$ or 8 inductance states can be achieved.

Figure 20A:
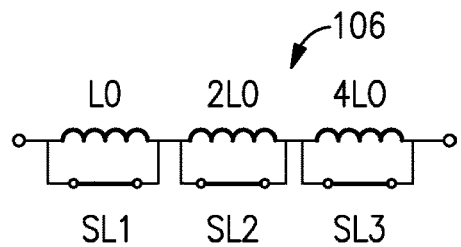
FIGS. 20A-20D show another example of a parasitic compensation circuit configured to provide different values of inductance L.
Figure 20B:
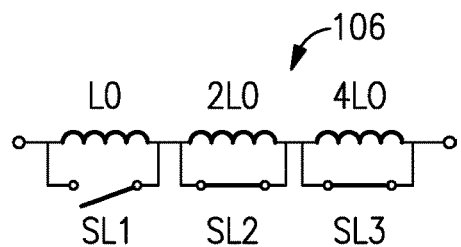
Figure 20C:
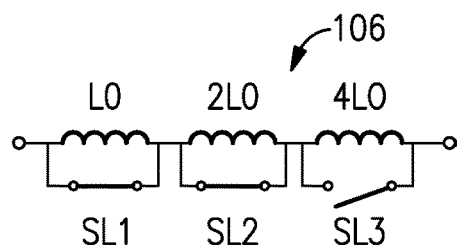
Figure 20D:
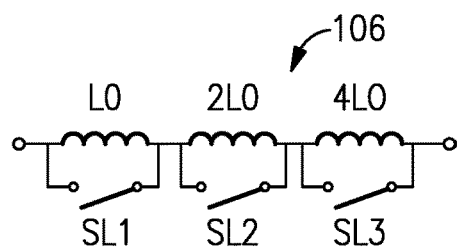

For example, FIG. 20A shows a state where all of the three switches (SL1 to SL3) are closed. Accordingly, each of the three inductors is bypassed, thereby yielding an overall inductance L of approximately 0. FIG. 20B shows a state where SL1 is open and the remaining switches are closed. Accordingly, the L0-inductor is active, and each of the remaining two inductors is bypassed, thereby yielding an overall inductance L of approximately L0. FIG. 20C shows a state where SL3 is open and the remaining switches are closed. Accordingly, the 4L0-inductor is active, and each of the remaining two inductors is bypassed, thereby yielding an overall inductance L of approximately 4L0. FIG. 20D shows a state where all three switches are open. Accordingly, each of the L0-inductor, 2L0-inductor, and 4L0-inductor is active, thereby yielding an overall inductance L of approximately 7L0. Table 1 lists the various combinations of the three inductors and their corresponding overall inductance values for L. In Table 1, an open switch corresponds to an active state of the corresponding inductor, and a closed switch corresponds to an inactive state of the inductor.

TABLE 1

| L0 inductor | 2L0 inductor | 4L0 inductor | Overall inductance L |
| --- | --- | --- | --- |
| Inactive | Inactive | Inactive | 0 |
| Active | Inactive | Inactive | L0 |
| Inactive | Active | Inactive | 2L0 |
| Active | Active | Inactive | 3L0 |
| Inactive | Inactive | Active | 4L0 |
| Active | Inactive | Active | 5L0 |
| Inactive | Active | Active | 6L0 |
| Active | Active | Active | 7L0 |

Figure 21:
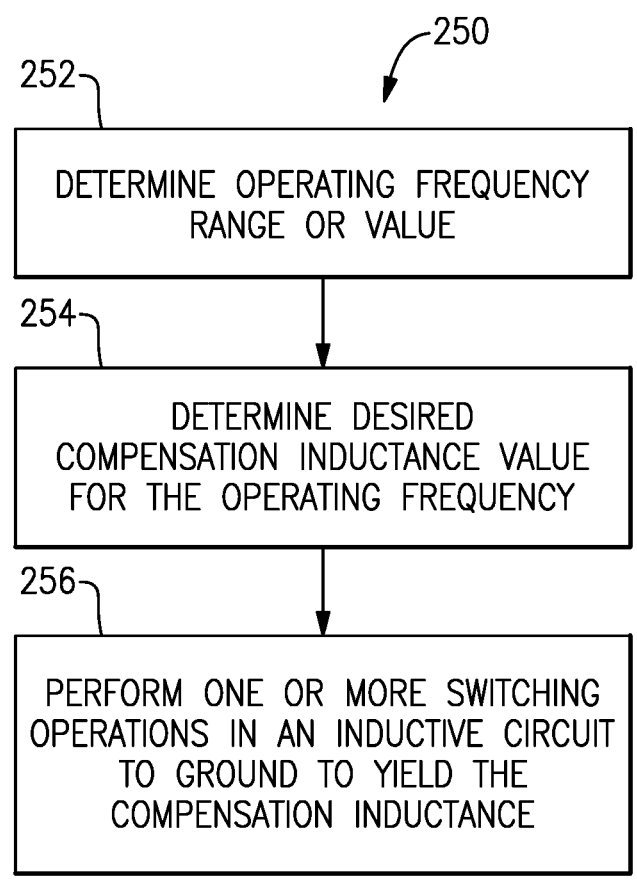
FIG. 21 shows a process that can be implemented to obtain a desired inductance in a parasitic compensation circuit having one or more features as described herein.

FIG. 21 shows a process 250 that can be implemented to obtain a desired inductance in a parasitic compensation circuit having one or more features as described herein. In block 252, an operating frequency range or value can be determined. In block 254, a desired compensation inductance value can be determined for the operating frequency. In some embodiments, such a compensation inductance value can be selected to compensate for an overall off-capacitance associated with a switch network configured to facilitate the operating frequency. In block 256, one or more switching operations can be performed in an inductive circuit that couples a common node of the switch network to ground, to yield the desired compensation inductance.

In some embodiments, one or more features of the present disclosure can be implemented in a number of products. FIGS. 22A-22D show non-limiting examples of such products in the context of RF modules. It will be understood that one or more parts of such RF modules can also be products having one or more features of the present disclosure.

Figure 22A:
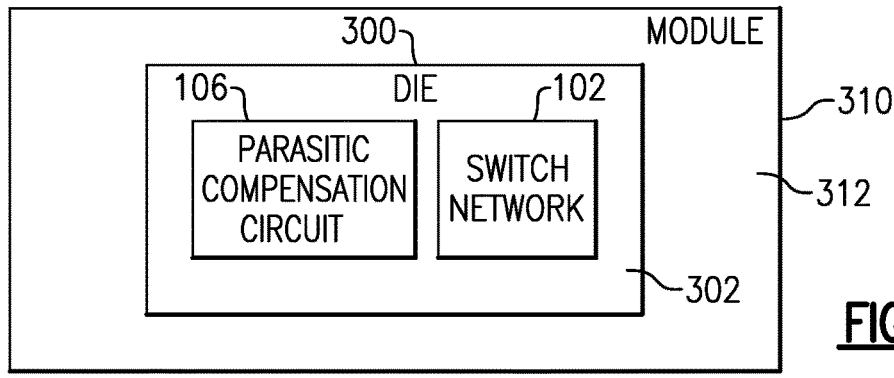
FIGS. 22A-22D show non-limiting examples of how a parasitic compensation circuit having one or more features as described herein can be implemented in an RF module.

For example, FIG. 22A shows that a semiconductor die 300 can include a switch network 102 and a parasitic compensation circuit 106 having one or more features as described herein. Such a die can include a die substrate 302. In some embodiments, the die 300 can be, for example, a silicon-on-insulator (SOI) die. FIG. 22A further shows that in some embodiments, the die 300 can be mounted on an RF module 310. Such a module can include a packaging substrate 312 configured to receive a plurality of components, including the die 300. Although not shown in FIG. 22A, other die and/or surface-mount device(s) (SMD(s)) can also be mounted on the packaging substrate 312. The packaging substrate can include, for example a laminate substrate or a ceramic substrate.

Figure 22B:
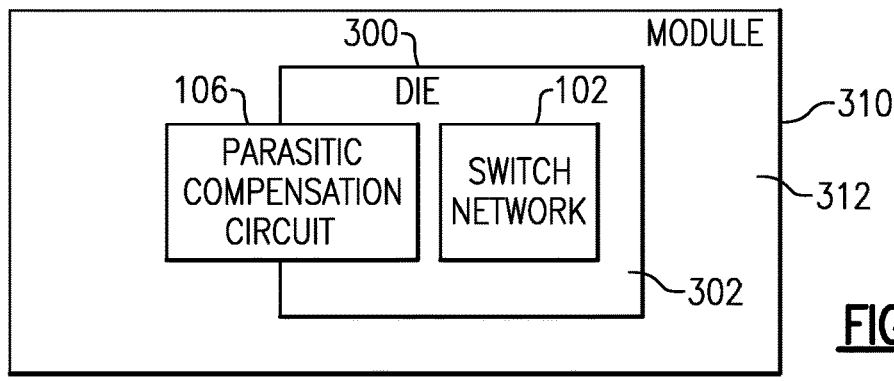

FIG. 22B shows a configuration where a die 300 having some of the one or more features as described herein is mounted on a packaging substrate 312 of an RF module 310. The die 300 is shown to include a die substrate 302. In the example shown, a switch network 102 having one or more features as described herein is shown to be implemented on the die 300, and a portion of a parasitic compensation circuit 106 is shown to be also implemented on the die 300. The other portion of the parasitic compensation circuit 106 is shown to be implemented outside of the die 300. Such other portion can be implemented on and/or within the packaging substrate (e.g., as part of the substrate, as a discrete component, or some combination thereof), on a separate die, or any combination thereof.

Figure 22C:
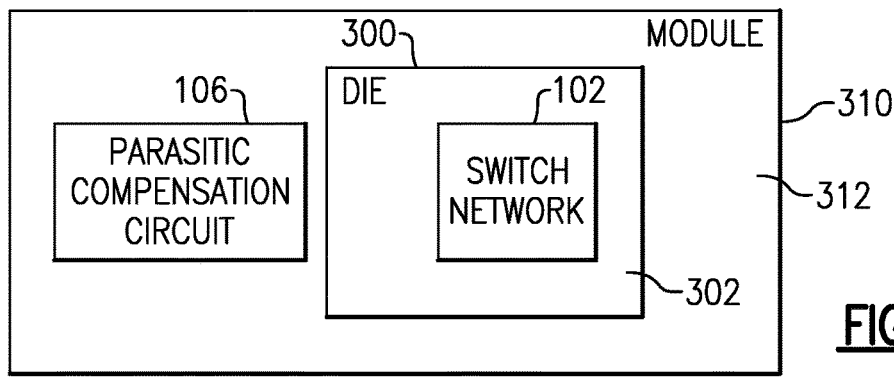
Figure 22D:
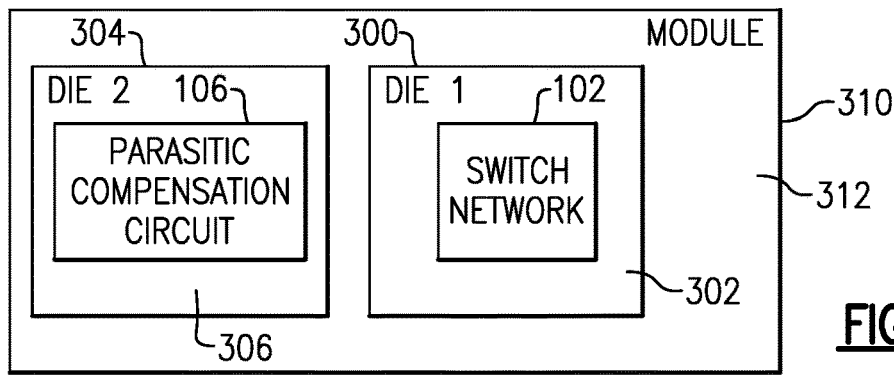

FIGS. 22C and 22D show examples of RF modules 310 where a die 300 includes a switch network 102, and a parasitic compensation circuit 106 is implemented substantially outside of the die 300. In the example of FIG. 22C, the parasitic compensation circuit 106 is shown to be implemented on and/or within the packaging substrate 312, substantially outside of the die 300. In the example of FIG. 22D, the parasitic compensation circuit 106 is shown to be implemented on a second die 304 having a die substrate 306. The two example die 300, 304 may or may not be based on the same process technology.

A parasitic compensation circuit having one or more features of the present disclosure is sometimes described as being implemented on a substrate such as a packaging substrate. It will be understood that such a parasitic compensation circuit can have portions implemented on a surface of the substrate, within the substrate, or any combination thereof.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 23:
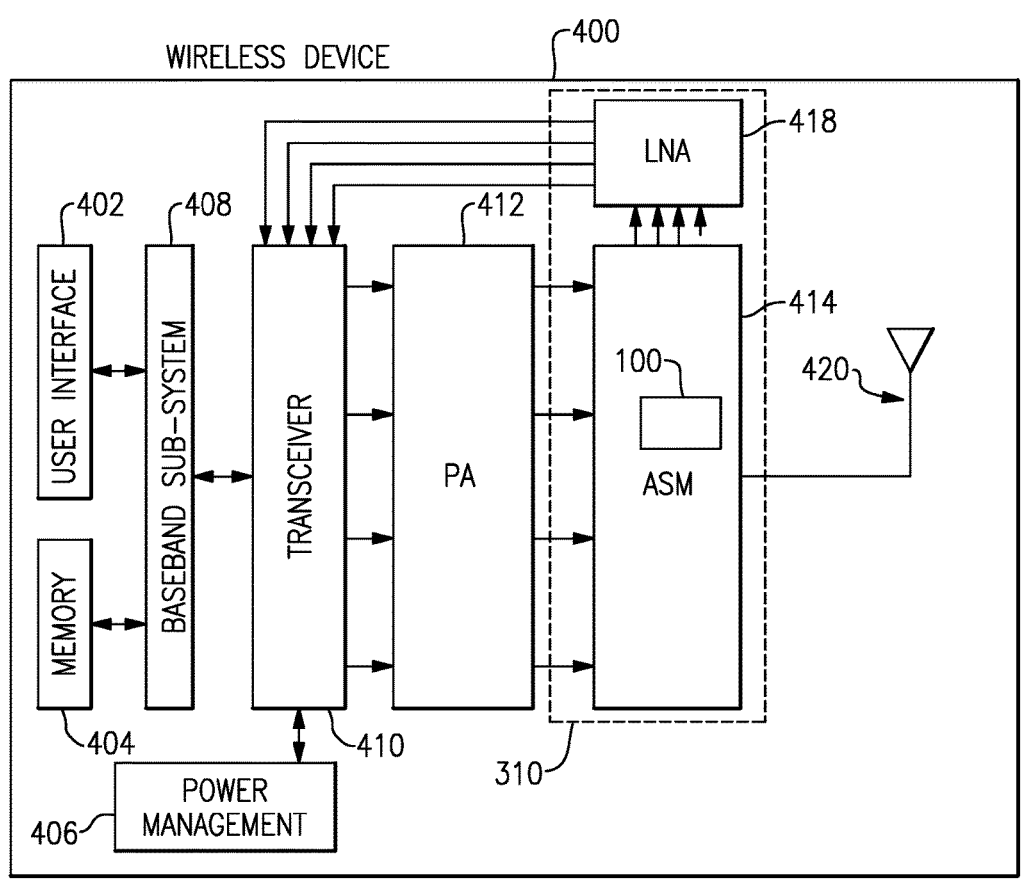
FIG. 23 depicts an example wireless device having one or more advantageous features described herein.

FIG. 23 depicts an example wireless device 400 having one or more advantageous features described herein. In some embodiments, such advantageous features can be implemented in a front-end (FE) module 310. In some embodiments, such a FEM can include more or less components than as indicated by the dashed box.

PAs in a PA module 412 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and other components of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, the front-end module 310 can include a switching architecture 100 configured to provide one or more functionalities as described herein. Such a switching architecture can be implemented in, for example, an antenna switch module (ASM) 414. In some embodiments, at least some of the signals received through an antenna 420 can be routed from the ASM 414 to one or more low-noise amplifiers (LNAs) 418. Amplified signals from the LNAs 418 are shown to be routed to the transceiver 410.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

In various examples disclosed herein, parasitic compensation circuits are described in an example context of inductance circuits. It will be understood that in some embodiments, such parasitic compensation circuits can also include other non-inductance elements.

In various examples described herein may refer to circuit elements such as capacitance, inductance and/or resistance. It will be understood that such circuit elements can be implemented as a devices such as capacitors, inductors and/or resistors. Such devices can be implemented as discrete devices and/or distributed devices.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switching circuit comprising: a common node;
   a plurality of series arm switches each capable of connecting the common node and a respective signal node and including a stack of transistor devices each having an off-capacitance;
   a shunt arm switch for each of the plurality of series arm switches, the shunt arm switch capable of connecting the signal node of the respective series arm switch to a ground and including a stack of transistor devices each having an off-capacitance; and
   a compensation circuit coupled to the common node and configured to compensate for a parasitic effect resulting from some or all of the plurality of series arm switches and the plurality of shunt arm switches.

2. The switching circuit of claim 1 wherein common node is, or connected to, an antenna port.

3. The switching circuit of claim 2 wherein each series arm switch is configured to connect the common node and its respective signal node when in an ON state, and disconnect the common node from its respective signal node when in an OFF state.

4. The switching circuit of claim 3 wherein each shunt arm switch is configured to connect its respective signal node to the ground when the corresponding series switch arm is in the OFF state, and disconnect the signal node from the ground when the corresponding series switch arm is in the ON state.

5. The switching circuit of claim 1 wherein each transistor device of the series arm switch includes N field-effect transistors arranged in a parallel configuration, and each transistor device of the shunt arm switch includes M field-effect transistors arranged in a parallel configuration, each of N and M being a positive integer.

6. The switching circuit of claim 1 wherein the compensation circuit includes an inductive circuit that couples the common node and the ground, the inductive circuit including an inductance.

7. The switching circuit of claim 6 wherein the inductance of the inductive circuit is selected to have a value that is inversely proportional to a total of off-capacitances associated with the plurality of series arm switches and the plurality of shunt arm switches.

8. The switching circuit of claim 6 wherein the sizes of either or both of the series arm and shunt arm switch transistors are larger than corresponding transistors of a switching circuit without the compensation circuit.

9. The switching circuit of claim 8 wherein the switching circuit with the compensation circuit has a lower insertion loss than the switching circuit without the compensation circuit.

10. The switching circuit of claim 8 wherein the switching circuit with the compensation circuit has a higher isolation level than the switching circuit without the compensation circuit.

11. The switching circuit of claim 6 wherein the inductive circuit is configured to provide a substantially fixed value for the inductance.

12. The switching circuit of claim 6 wherein the inductive circuit is configured to provide a plurality of different values for the inductance.

13. A packaged module for radio-frequency applications, comprising:
a packaging substrate configured to receive a plurality of components; and a switching circuit implemented on the packaging substrate and including a common node, and a plurality of series arm switches each capable of connecting the common node and a respective signal node and including a stack of transistor devices each having an off-capacitance, the
switching circuit further including a shunt arm switch for each of the plurality of series arm switches, the shunt arm switch capable of connecting the signal node of the respective series arm switch to a ground and including a stack of transistor devices each having an off-capacitance, the switching circuit further including a compensation circuit coupled to the common node and configured to compensate for a parasitic effect resulting from some or all of the one or more series arm switches and the plurality of shunt arm switches.

14. The packaged module of claim 13 wherein at least the plurality of series arm switches and the plurality of shunt arm switches are implemented on a semiconductor die that is mounted on the packaging substrate.

15. The packaged module of claim 14 wherein the semiconductor die includes a silicon-on-insulator substrate.

16. The packaged module of claim 15 wherein each of the transistor devices of the plurality of series arm switches and the transistor devices of the plurality of shunt arm switches includes a stack of field-effect transistor implemented on the silicon-on-insulator substrate.

17. The packaged module of claim 14 wherein the semiconductor die further includes at least a portion of the compensation circuit.

18. A wireless device comprising: a receiver circuit;
an antenna; and
a switch circuit implemented to route one or more signals between the antenna and the receiver circuit, the switching circuit including a common node coupled to the antenna, and a plurality of series arm switches each capable of connecting the common node and a respective signal node and including a stack of transistor devices each having an off-capacitance, the
switching circuit further including a shunt arm switch for each of the one or more series arm switches, the shunt arm switch capable of connecting the signal node of the respective series arm switch to a ground and including a stack of transistor devices each having an off-capacitance, the switching circuit further including a compensation circuit coupled to the common node and configured to compensate for a parasitic effect resulting from some or all of the one or more series arm switches and the plurality of shunt arm switches.

19. The wireless device of claim 18 wherein the antenna is a diversity antenna.

* * * * *